United States Patent
Mizuno

(10) Patent No.: US 7,675,695 B2
(45) Date of Patent: Mar. 9, 2010

(54) OPTICAL ELEMENT HOLDING APPARATUS

(75) Inventor: Makoto Mizuno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 12/037,652

(22) Filed: Feb. 26, 2008

(65) Prior Publication Data

US 2008/0204904 A1    Aug. 28, 2008

(30) Foreign Application Priority Data

Feb. 28, 2007  (JP) .............................. 2007-049367
Feb. 25, 2008  (JP) .............................. 2008-043071

(51) Int. Cl.
*G02B 7/02* (2006.01)
(52) U.S. Cl. .................... 359/811; 359/822; 359/823
(58) Field of Classification Search ......... 359/811–823, 359/694–700
See application file for complete search history.

(56) References Cited

U.S. PATENT DOCUMENTS 5,973,863 A * 10/1999 Hatasawa et al. ........... 359/823
6,445,516 B2 * 9/2002 Osterried .................... 359/819
6,930,842 B2 * 8/2005 Shibazaki ................... 359/822
7,345,834 B2 * 3/2008 Murasato .................... 359/819

FOREIGN PATENT DOCUMENTS

JP        10-054932 A     2/1998
JP      2001-343575 A    12/2001

* cited by examiner

*Primary Examiner*—Mohammed Hasan
(74) *Attorney, Agent, or Firm*—Canon U.S.A., Inc. I.P. Division

(57) ABSTRACT

A holding apparatus configured to hold an optical element includes a supporting member configured to support the optical element, a cylindrical member configured to support the supporting member, a plurality of sensors configured to detect a position of the optical element and the supporting member, and a drive unit configured to drive the supporting member based on outputs from the plurality of sensors. The supporting member includes a plurality of projection portions that contact the optical element. A direction of each vertex of a polygon formed by connecting the plurality of projection portions with a straight line substantially coincides with a direction of each vertex of a polygon formed by connecting the plurality of sensors with a straight line.

5 Claims, 15 Drawing Sheets

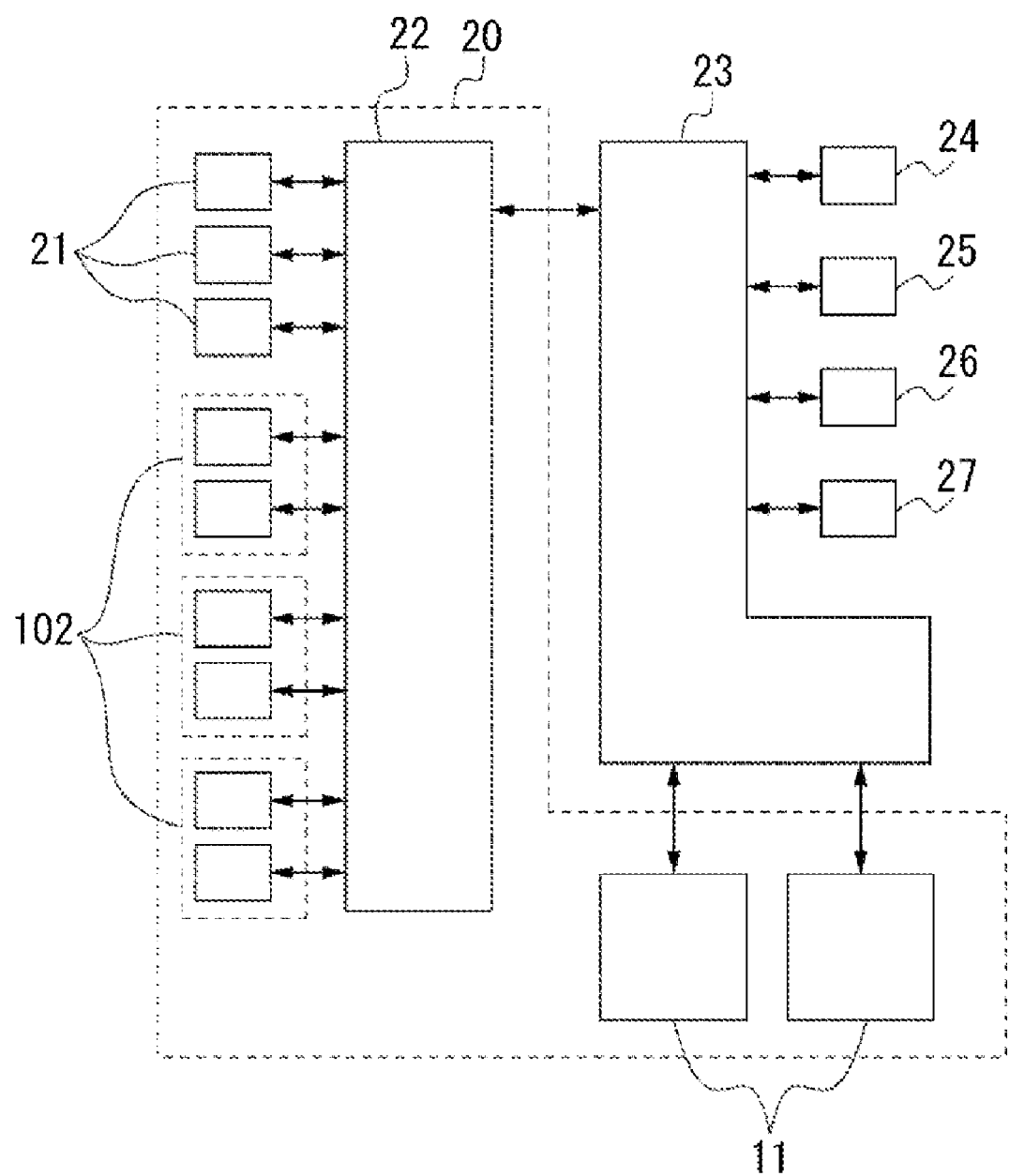

OPTICAL ELEMENT HOLDING APPARATUS

BACKGROUND OF THE INVENTION

1. Field of the Invention

The present invention relates to a holding apparatus configured to hold an optical element.

2. Description of the Related Art

A holding apparatus configured to hold an optical element is used in apparatuses such as a semiconductor exposure apparatus.

The semiconductor exposure apparatus is an apparatus used in forming a circuit by transferring a pattern of a reticle on a silicon wafer. In order to form a highly-integrated circuit, it is necessary to improve overlay accuracy of multiple patterns which are transferred onto the silicon wafer.

In order to improve the overlay accuracy, it is necessary to reduce alignment error, magnification error, and image distortion. The alignment error can be reduced by adjusting a relative position of the reticle and the wafer. The magnification error can be reduced by moving a part of an optical element, which constitutes a portion of a projection optical system, in the optical axis direction.

When the optical element is moved in the optical axis direction, error components having directions other than the optical axis, particularly, parallel decentering and tilt error, need to be controlled so that they do not increase. The image distortion can be reduced by parallel-decentering or tilt-decentering a portion of the optical element, which constitutes the projection optical system.

Under the above circumstances, a holding apparatus having a movement mechanism for an optical element, which allows an improvement in the overlay accuracy, is drawing attention. For example, Japanese Patent Application Laid-Open No. 2001-343575 discusses such a holding apparatus. FIG. 14 illustrates a configuration of the holding apparatus discussed in Japanese Patent Application Laid-Open No. 2001-343575.

In FIG. 14, a movable lens 38a is supported by a plurality of receiving seats, which protrude from an inner circumference of a first lens cell 46, and fixed to the first lens cell 46 by a lens pressing member or the like. The first lens cell 46 is fixed to an inner ring portion 44a. The inner ring portion 44a is driven in the optical axis direction by an actuator 50 via a link arm 59.

Three actuators 50 are provided at equal angular intervals along the periphery of an outer ring portion 44b located lateral to the inner ring portion 44a. Further, a sensor 72 is provided between the actuators 50. The sensor 72 measures the position of the inner ring portion 44a in relation to the outer ring portion 44b. The number of sensors 72 is three and each of the sensors 72 can measure a relative amount of displacement of the inner ring portion 44a to the outer ring portion 44b in the optical axis direction.

FIG. 15 illustrates a holding apparatus discussed in Japanese Patent Application Laid-Open No. 10-054932.

In a projection optical system 10 illustrated in FIG. 15, each of a plurality of lens elements 2a is held by an annular lens frame. Each lens frame is supported by an inner protruding portion of lens barrels 62a, 62b, and 62c. Further, actuators 60b and 60c configured to drive the lens barrels 62a, 62b, and 62c and displacement detectors 64a and 64b configured to detect displacement between the lens barrels 62a, 62b, and 62c are mounted on outer protruding portions 36a, 36b, and 36c of the lens barrels 62a, 62b, and 62c.

According to the configuration discussed in Japanese Patent Application Laid-Open No. 2001-343575, when the inner ring portion 44a is tilted, the inner ring portion 44a may be deformed. This deformation is caused by an insufficient margin in rotation direction at a coupling portion between the inner ring portion 44a and the actuator 50, which mainly drives the inner ring portion 44a. Then, the deformation of the inner ring portion 44a may have an adverse effect on a result of detection of an amount of tilt by the sensor 72, so that the sensor 72 cannot accurately detect a tilt of the inner ring portion 44a. Thus, a deviation in tilt may occur between the movable lens 38a and the inner ring portion 44a.

In the holding apparatus discussed in Japanese Patent Application Laid-Open No. 10-054932, the displacement detectors 64a and 64b detect displacement between the lens barrels 62a, 62b, and 62c, and the actuators 60b and 60c drive the lens barrels 62a, 62b, and 62c. Accordingly, it is difficult to accurately position the lens barrels 62a, 62b, and 62c, which are relatively heavy.

SUMMARY OF THE INVENTION

The present invention is directed to a holding apparatus which is capable of measuring a position of an optical element while reducing measurement error caused by a deformation of a supporting member which supports the optical element or by a difference of tilt between the optical element and the supporting member.

According to an aspect of the present invention, a holding apparatus configured to hold an optical element includes a supporting member configured to support the optical element, a cylindrical member configured to support the supporting member, a plurality of sensors configured to detect a position of the optical element and the supporting member, and a drive unit configured to drive the supporting member based on outputs from the plurality of sensors. The supporting member includes a plurality of projection portions that contact the optical element. A direction of each vertex of a polygon formed by connecting the plurality of projection portions with a straight line substantially coincides with a direction of each vertex of a polygon formed by connecting the plurality of sensors with a straight line.

According to another aspect of the present invention, a holding apparatus configured to hold an optical element includes a supporting member configured to support the optical element, a cylindrical member configured to support the supporting member, a plurality of sensors configured to detect a position of the optical element and the supporting member, and a drive unit configured to drive the supporting member based on outputs from the plurality of sensors. The supporting member includes a plurality of projection portions that contact the optical element. The plurality of projection portions exist substantially on a same plane. If an axis perpendicular to the plane and passing through a center of gravity of a polygon formed by connecting the plurality of projection portions with a straight line is set as an axis of rotation, the plurality of projection portions are located in substantially a same direction as the plurality of sensors in a direction of rotation around the axis of rotation.

According to yet another aspect of the present invention, a holding apparatus configured to hold an optical element includes a supporting member configured to support the optical element, a cylindrical member configured to support the supporting member, a plurality of sensors configured to detect a position of the optical element and the supporting member, and a drive unit configured to drive the supporting member based on outputs from the plurality of sensors. The supporting member includes a plurality of projection portions that contact the optical element. The plurality of projection portions exist substantially on a same plane. If an axis perpendicular to the plane and passing through a center of gravity of the optical element is set as an axis of rotation, the plurality of projection portions are located in substantially a same direction as the plurality of sensors in a direction of rotation around the axis of rotation.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 6 illustrates an example control system configured to control an optical element.

DETAILED DESCRIPTION OF THE EMBODIMENTS

Various exemplary embodiments, features, and aspects of the invention will be described in detail below with reference to the drawings.

First Exemplary Embodiment

An optical element holding apparatus according to a first exemplary embodiment of the present invention will now be described. According to the present exemplary embodiment, the holding apparatus holds an optical element, which constitutes a part of a projection optical system of an exposure apparatus. However, the holding apparatus can be used for other apparatuses such as a positioning apparatus used for high-accuracy positioning of an optical element.

Figure 1:
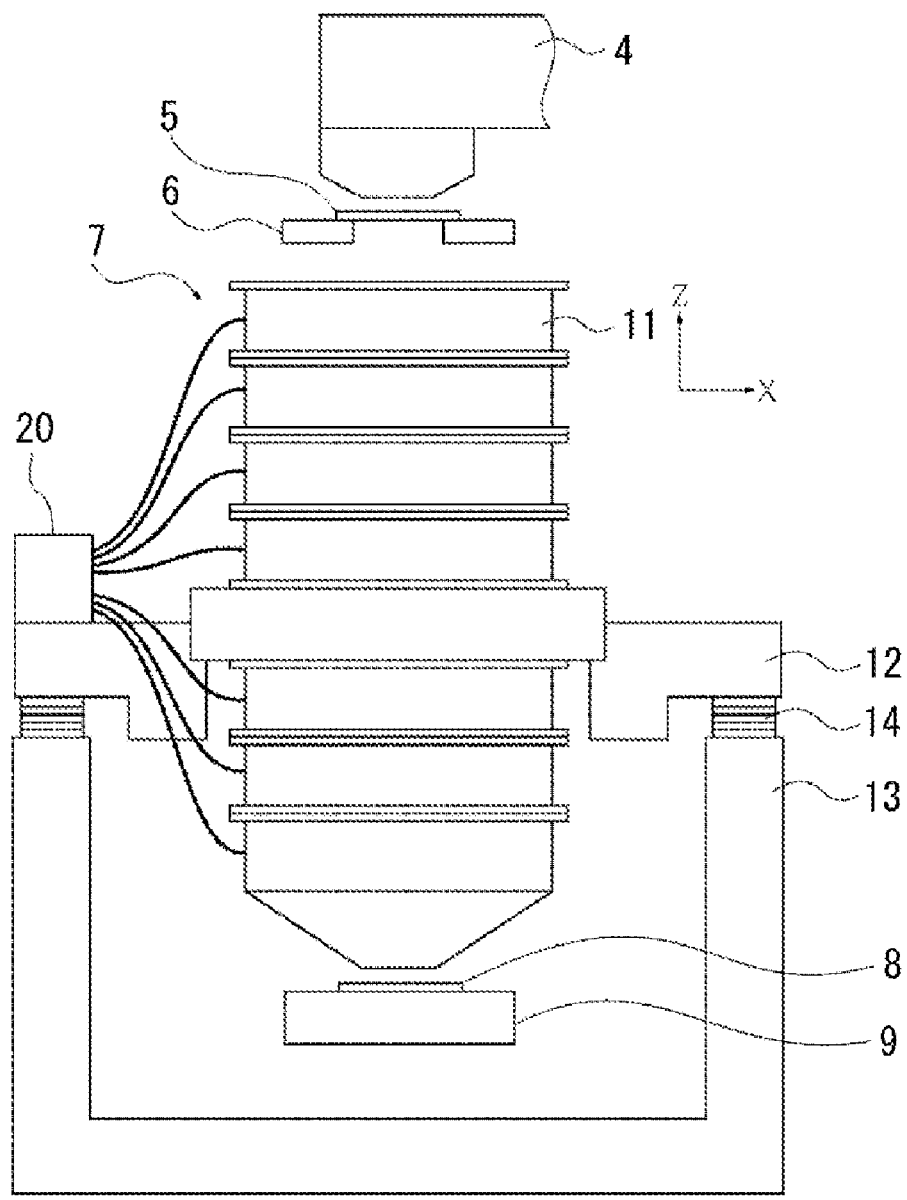
FIG. 1 is a schematic view of an example exposure apparatus.

FIG. 1 is a schematic view of a scanning exposure apparatus, on which the holding apparatus is mounted. The exposure apparatus includes an illumination unit 4 configured to emit slit light onto a reticle (original plate) 5, a reticle stage 6 configured to hold and move the reticle 5, a projection optical system 7 configured to project a pattern of the reticle 5 onto a wafer (substrate) 8, and a wafer stage 9 configured to hold and move the wafer (substrate) 8.

The projection optical system 7 includes a plurality of lens barrels 11 (cylindrical members), which are joined in the optical axis direction, which is a direction parallel to the Z-axis direction in FIG. 1, as they are mounted one upon another. The projection optical system 7 is supported by a lens barrel support member 12 serving as a supporting body. The lens barrel support member 12 is supported by a main body 13, which is placed on the floor, via a vibration isolation mechanism 14. The vibration isolation mechanism 14 can prevent vibration from the floor from being transmitted to the projection optical system 7.

According to the above-described configuration, when an exposure is started, the reticle stage 6 is moved in a scanning manner in synchronization with the movement of the wafer stage 9. The wafer stage 9 includes a moving mechanism that allows the wafer stage 9 to move in the optical axis direction. According to this moving mechanism, focus adjustment can be performed during the exposure.

Figure 2A:
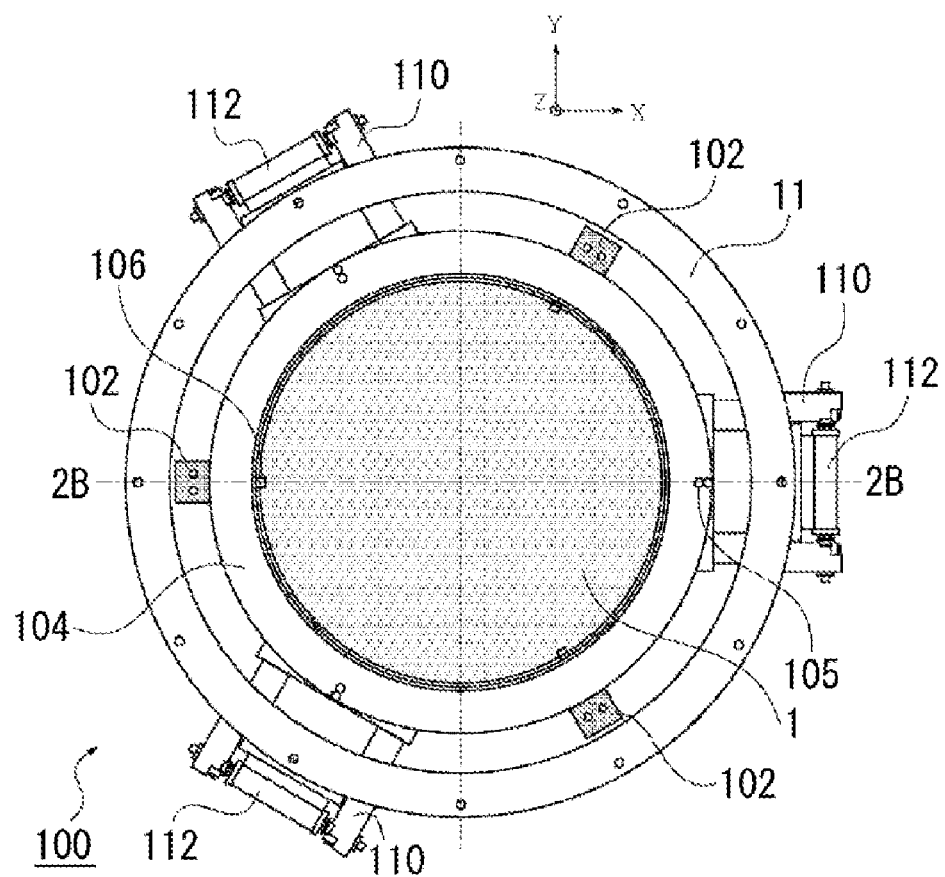
FIGS. 2A and 2B illustrate an example holding apparatus according to a first exemplary embodiment of the present invention.
Figure 2B:
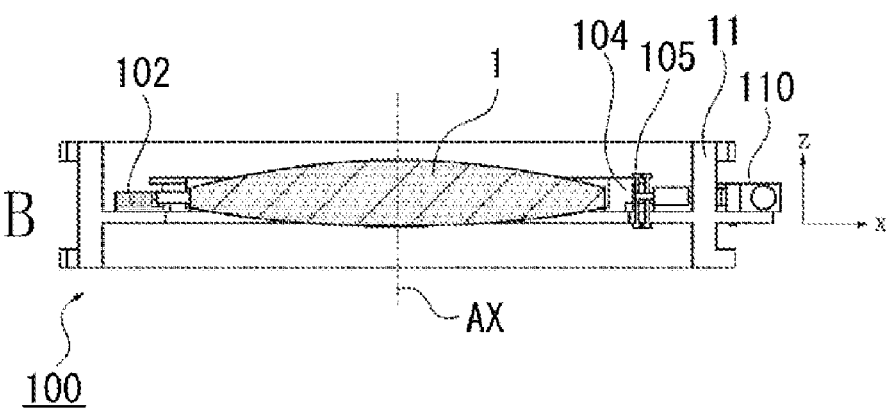

FIG. 2A is an internal plan view of the lens barrel 11 as viewed from the optical axis direction. FIG. 2B is a cross section taken along line 2B-2B in FIG. 2A. In FIG. 2B, an axis extending in the optical axis direction is the Z-axis. The X-axis and the Y-axis are perpendicular to each other on a plane that is perpendicular to the Z-axis. The optical axis of the optical element 1 is represented by a dash-dot line AX.

The projection optical system 7 includes a plurality of optical elements 1, each of which has a predetermined optical power. The optical element 1 is located in the lens barrel 11. According to the present exemplary embodiment, the optical element 1 is a lens. However, the optical element 1 can also be another optical element, such as a mirror. Further, the shape of the optical element 1 is not limited.

Next, a holding apparatus 100 that holds the optical element 1 will be described with reference to FIGS. 2A to 5B.

The holding apparatus 100 includes a support frame (supporting member) 104. The support frame 104 contacts a periphery of the optical element 1 at a plurality of places and supports the optical element 1. Further, the holding apparatus 100 includes a plurality of position sensors 102 configured to detect displacement of the optical element 1 or a target member mounted on the optical element 1, and a drive mechanism 110 including an actuator configured to move the optical element 1 based on outputs from the position sensors 102. The position sensors 102 are provided at a plurality of places.

The support frame 104 contacts the optical element 1 in the optical axis direction at a projection portion 106, which is provided on the support frame 104, and supports the optical element 1. The optical element 1 is supported in the radial direction by an adhesive that is filled in a small gap between the support frame 104 and the optical element 1. The projection portion 106 is a portion where the optical element 1 and the support frame 104 contact, as illustrated in FIG. 9B. The projection portion 106 is provided along the periphery of the optical element 1 in three places around the optical axis at an angular interval of approximately 120°.

In other words, the support frame 104 supports the optical element 1 in three places around the optical axis in the rotation direction at equal intervals. According to this support by the support frame 104, the impact of the deformation of the optical element 1 on the optical performance can be reduced. A 0.05 to 0.2 mm gap between the optical element 1 and the support frame 104 will be sufficient. The adhesive can be filled approximately along the whole circumference of the optical element 1. The adhesive hardens in the gap according to a viscosity and a surface tension of the adhesive.

Six notches are provided along the periphery of the support frame 104, which supports the optical element 1. Each of three notches out of the six notches is joined to an output portion of the drive mechanism 110 with a support frame mounting screw 105. It is to be noted that by adjusting a height of three joint portions of the three notches to a relatively same height using a spacer (not shown) provided between the drive mechanism 110 and the support frame 104, deformation can be prevented from being transmitted to the support frame 104 and the optical element 1. Further, the rest of the notches are arranged in a position opposite to the position sensors 102. The size of the holding apparatus can be reduced by arranging a portion, which is to be detected by the position sensor 102, at the inner side of the notches of the support frame 104.

The drive mechanism 110 and the position sensor 102 are mounted on the lens barrel 11 at its flat portion and arranged in three places around the optical axis at an angular interval of approximately 120°. The drive mechanism 110 (or a piezo actuator 112) and the position sensor 102 are displaced 60° with respect to each other. This arrangement contributes to improving space efficiency and reducing the size of the holding apparatus. The drive mechanism 110 is controlled by an optical element control system 20. By driving a predetermined optical element, the drive mechanism 110 is capable of optimizing the optical performance of the projection optical system 7. The optical element control system 20 controls the drive mechanism 110 based on information sent from various sensors, such as a pressure sensor, and a program stored in advance in a memory.

Next, details of the position sensor 102 will be described.

The position sensor 102 is used in detecting displacement of the optical element 1 in the optical axis direction and in a radial direction perpendicular to the optical axis. Although various types of instruments, such as a gauge interferometer using semiconductor laser, an electrostatic capacitance displacement meter, a linear encoder, a differential transformer displacement gauge, and an eddy current displacement gauge, can be used as the position sensor 102 depending on the required accuracy, the electrostatic capacitance displacement meter is used in the present exemplary embodiment.

Figure 3A:
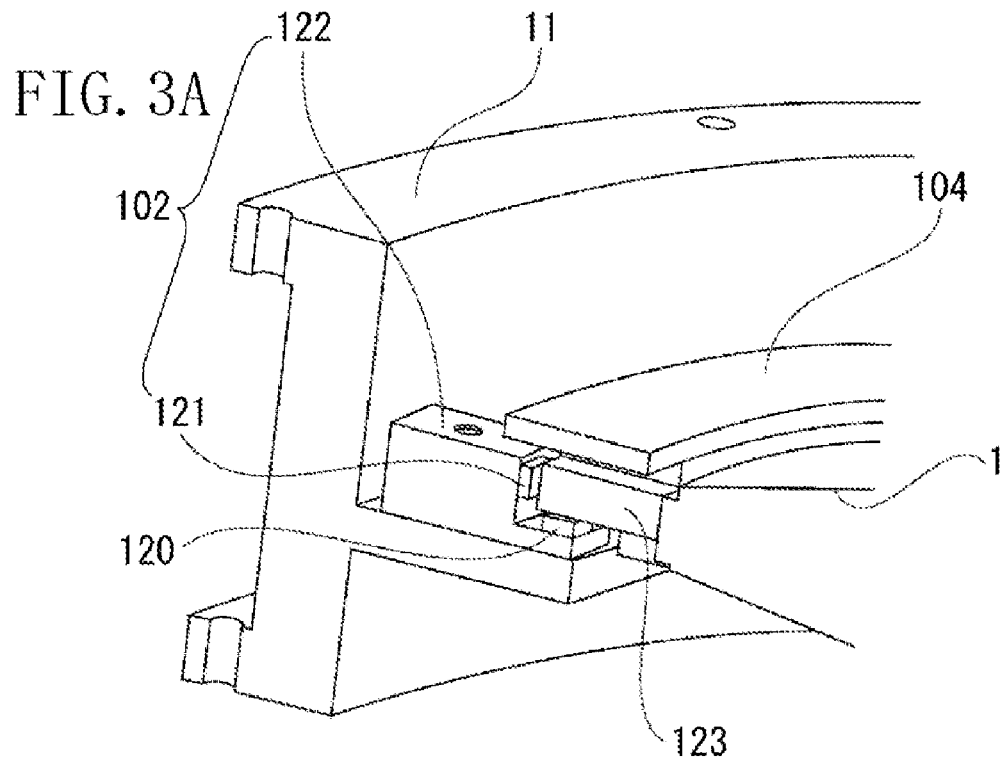
FIGS. 3A and 3B are detail drawings of an example position sensor of the holding apparatus.
Figure 3B:
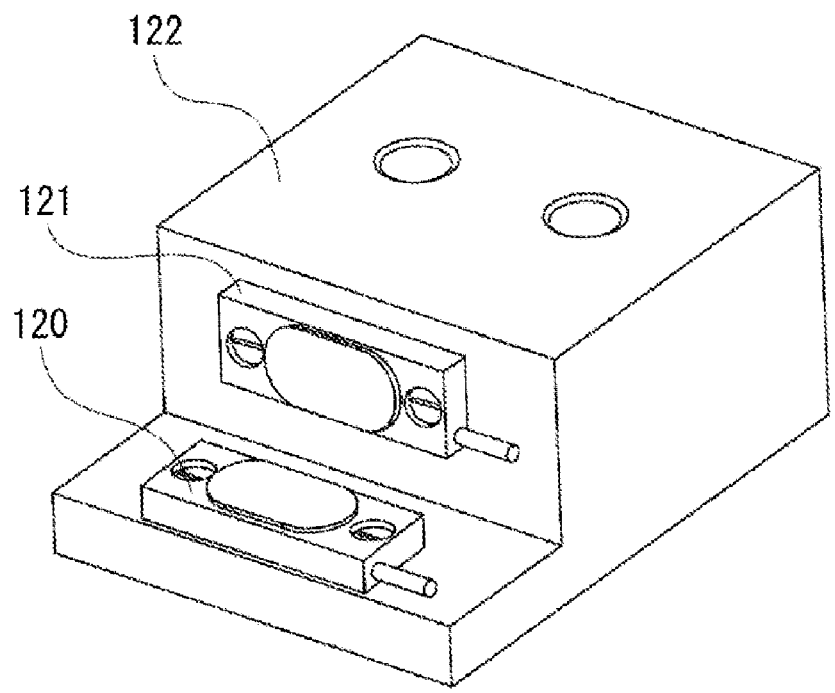

FIG. 3A is a cross-sectional perspective view of the position sensor 102 illustrated in FIG. 1. FIG. 3B is a perspective view of a sensor head and a bracket.

The position sensor 102 includes a sensor bracket 122 and a sensor head, which is fixed to the sensor bracket 122 with a screw. The sensor head includes a Z-sensor head 120 and an R-sensor head 121. The Z-sensor head 120 measures a relative displacement of the support frame 104 to the lens barrel 11 in the optical axis direction. The R-sensor head 121 measures a relative displacement of the support frame 104 in the radial direction perpendicular to the optical axis.

Further, a target member 123 is mounted on a side face of the optical element 1. The target member 123 is detected by the position sensor 102. The target member 123 can be integrally formed with the optical element 1 or fixed to the optical element 1 by adhesion, welding, or screwing. The target member 123 can be made of a material having approximately the same coefficient of linear thermal expansion as that of the optical element 1, and can also be made of the same material as that of the optical element 1.

However, when a capacitance-type sensor is used as the position sensor 102, the portion that is to be detected needs to be electrically conductive. Thus, a surface (detected portion) of the target member 123 needs to be covered with a metal film, such as an aluminum film, by sputtering or by vacuum evaporation deposition. For example, if the target member 123 is made of a glass material, a metal film can be formed on the detected portion of the target member 123.

Further, when a capacitance-type sensor is used as the position sensor 102, an electrode of the target member 123 and a converter of the position sensor 102 need to be wired. According to the present exemplary embodiment, the wiring is fixed to the support frame 104 so that vibration is not transmitted to the optical element 1 via the wiring.

As described with reference to FIG. 2A, the position sensor 102 is mounted on three places around the optical axis at an angular interval of approximately 120°. Each of the position sensors 102 is arranged in approximately equal intervals from the optical axis. According to this configuration, displacement in the X-axis, the Y-axis, and the Z-axis directions and angular displacement (amount of rotation) in the direction of rotation around the X-axis and the Y-axis can be measured. In other words, a mean value of three displacement values acquired from the three Z-sensor heads can be calculated as a displacement of the center of the optical element 1 in the Z-axis direction. Further, an angular displacement around the X-axis and the Y-axis can be calculated based on an angle formed by a plane that includes three points which corresponds to the three displacement values and a plane perpendicular to the optical axis.

According to the present exemplary embodiment, the optical element 1 can be driven in three directions (the Z-axis direction, rotation around the X-axis, and rotation around the Y-axis) by the drive mechanism 110. Thus, the position of the optical element 1 can be controlled based on three displacement values in the three directions obtained from the three position sensors 102. It is to be noted that the displacement in the X-axis and the Y-axis directions obtained from the position sensors 102 can be used to correct an amount of drive of the wafer stage 9 or an amount of drive of a drive mechanism provided for another optical element.

According to the present exemplary embodiment, the displacement of the target member 123 mounted on the optical element 1 is detected. However, the displacement of the optical element 1 or the support frame 104 can be detected. In such a configuration, a difference in tilt between the optical element 1 and the support frame 104, which is caused by a deformation of the support frame 104, can also be reduced. For example, by detecting the displacement of the optical element 1 or the target member 123 mounted on the optical element 1, measurement error due to deformation of the support frame 104 or difference in tilt of the support frame 104 and the optical element 1 can be reduced.

Further, the optical element 1 may be deformed in the optical axis direction by gravitation at portions other than those supported by the projection portions 106. Additionally, the support frame 104 may be slightly deformed when the optical element 1 is rotated around the X-axis or the Y-axis by the drive mechanism 110.

According to the present exemplary embodiment, a portion where the projection portion 106 contacts the optical element 1 and a portion to be detected by the position sensor 102, which is the target member 123, are located in substantially the same direction in a rotation direction around an axis of rotation. In this context, contact portions where the projection portion 106 contacts the optical element 1 exist substantially on a first plane, and the axis of rotation is an axis that is perpendicular to the first plane and passes through a center of gravity of the optical element 1. Then, an allowable limit of difference between the portion where the projection portion 106 contacts the optical element 1 and the portion detected by the position sensor 102 in the same direction depends on an optical sensitivity of the optical element 1, in other words, permissible error of the optical element 1. For example, if the difference is within a range of ±5 degrees, in most cases, the difference does not cause a tilt angle detection error. Further, the optical element 1 can be located so that it does not interfere with the drive mechanism 110 even if the diameter of the optical element 1 is relatively small. In this way, the detection can be performed where the above-described deformation is small. In other words, the measurement error by deformation can be reduced further.

Further, in place of the axis of rotation that passes through the center of gravity of the optical element 1, an axis perpendicular to the first plane and passing through a center of gravity of a polygon formed by connecting a plurality of contact portions with a straight line can be used as the axis of rotation. Naturally, the axis of rotation that passes through the center of gravity of the optical element 1 can coincide with the axis that passes through the center of gravity of the polygon.

According to the present exemplary embodiment, the optical axis of the optical element 1 coincides with the above-described axis of rotation. However, the present invention can also be applied to a case where the optical axis does not coincide with the axis of rotation. This case will be described in the third exemplary embodiment. In the first exemplary embodiment, the optical axis can be replaced with the above-described axis of rotation.

Further, as an alternative view, if the number of the contact portions and the sensors is three or more as with the present exemplary embodiment, directions of vertices of a polygon formed by connecting the plurality of contact portions with a straight line can substantially coincide with directions of vertices of a polygon formed by connecting the portions detected by the sensors with a straight line.

As described above, the position sensor 102 detects relative displacement of the optical element 1 or the target member 123 to the lens barrel 11.

Figure 4A:
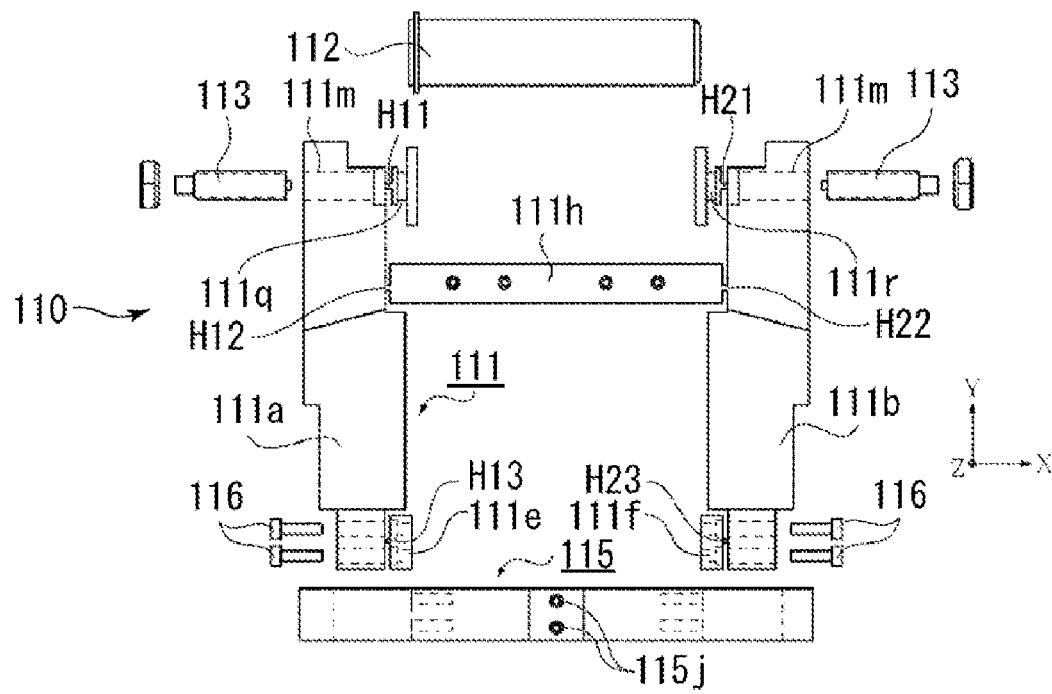
FIGS. 4A to 4C illustrate an example drive mechanism.
Figure 4B:
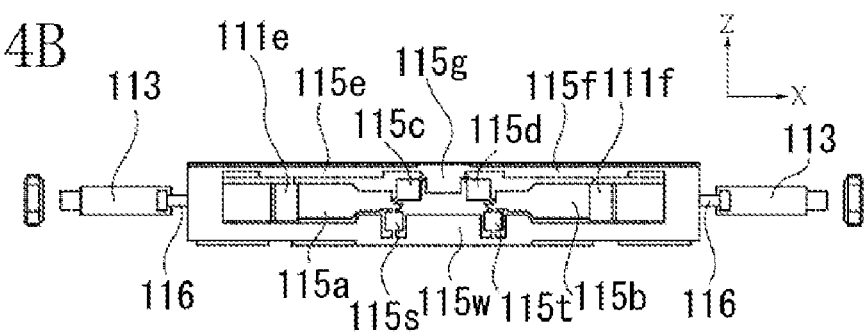
Figure 4C:
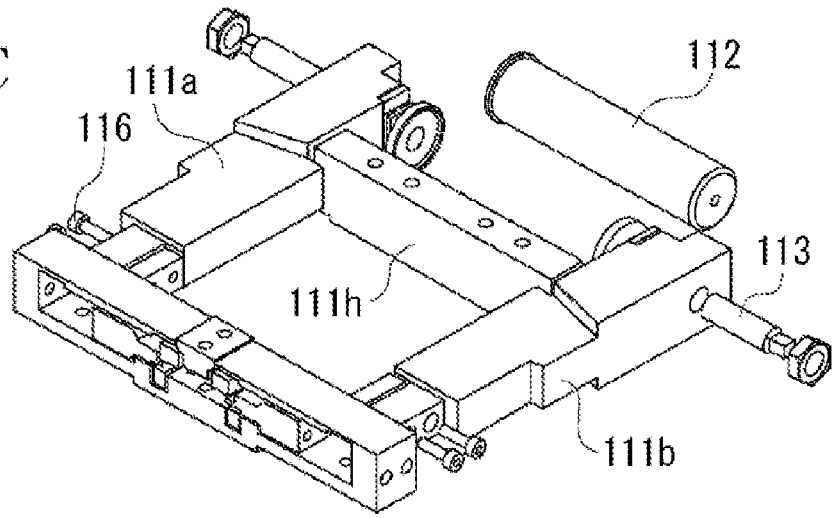

Next, details of the drive mechanism 110 will be described. FIG. 4A is an exploded plan view of the drive mechanism 110 as viewed from the optical axis direction. FIG. 4B is a side view and FIG. 4C is a perspective view.

The drive mechanism 110 includes the piezo actuator 112, a main body 111, which transmits the displacement of the piezo actuator 112, and a change-direction member 115, which changes a direction of the displacement transmitted from the main body 111. The piezo actuator 112 includes a drive source, in which electrostrictive elements and electrodes are alternately built up, and an extendable air-tight cylindrical container configured to contain the drive source. The length of the piezo actuator 112 extends in the X-axis direction approximately in proportion to an applied voltage. It is to be noted that although a piezo actuator is used in the present exemplary embodiment, a direct acting mechanism with a combination of a motor and a ball screw can also be used.

The main body 111 has a shape roughly of an "H" and includes a plurality of links (e.g., 111a, 111b, and 111h), which constitutes a link mechanism. The change-direction member 115 has two apertures and includes a plurality of links (e.g., 115a, 115b, 115c, and 115d), which constitutes another link mechanism. According to these link mechanisms, a displacement of the piezo actuator 112 in the X direction is transmitted from the main body 111 to the change-direction member 115 and further output by the change-direction member 115 as a displacement in the Z direction. Details of the link mechanisms will be described below.

Next, a manufacturing method of the main body 111 and the change-direction member 115 will be described.

First, an outline of the main body or the link mechanism is formed by processing a base material, which is a metal block, by milling or by wire electric discharge machining. Next, after forming a screw hole for the fix link 111h by a drilling tool, a hole before threading for an installation screw hole and a relief hole for the installation screw hole is made from the side faces of the displacement retrieval links 111a and 111b. Then, a piezo adjustment screw hole 111m for a piezo adjustment screw 113 is made.

Similarly, an outline of the change-direction member 115 or the link mechanism is formed by processing a base material, which is a metal block, by milling or by wire electric discharge machining. Next, after forming a hole before threading for a lens frame mount screw hole 115j, a hole before threading for the mount screw hole and a relief hole for the mount screw hole are made on both sides of the block. Then, the lens frame mount screw hole 115j and a hole before threading for the screw holes of the horizontal links 115a and 115b are made.

Next, a procedure of assembling the drive mechanism 110 will be described.

First, the displacement retrieval links 111a and 111b and connection links 111e and 111f are inserted into the two apertures formed on the change-direction member 115. Next, the displacement retrieval links and the connection links are connected by change member joint screws 116. Then, the piezo actuator 112 is fixed to the displacement retrieval links 111a and 111b via piezo receive links 111q and 111r. After then, by screwing the piezo adjustment screws 113 into the displacement retrieval links 111a and 111b from the outside of the piezo adjustment screw hole 111m, the piezo actuator 112 is set to the piezo receive links 111q and 111r.

As described above, the piezo adjustment screw 113 is used in adjusting a dimensional error of the piezo actuator 112 and further used in providing preload. Since an amount which the piezo adjustment screw 113 is screwed into the displacement retrieval link 111a or 111b is generally proportional to an amount of preload of the piezo actuator 112, effect caused by variation in a property of the piezo actuator 112 can be reduced by adjusting this amount.

The amount which the piezo adjustment screw 113 is screwed into the displacement retrieval link can be adjusted by a dial gage. For example, an amount a lens frame drive link 115g moves in the Z-axis direction can be measured with a dial gage. Further, the piezo adjustment screw 113 can be held in place by a nut.

Finally, using drive mechanism mounting screws, portions of the change-direction member 115, which are not displaced, and the fix link 111h are fixed to the flat portions of the lens barrel 11, and the assembly process ends. In FIG. 4C, the change-direction member 115 is fixed to the lens barrel 11 at three places at its bottom. This contributes to preventing measurement error caused by the drive force of the drive mechanism. If the change-direction member 115 is not fixed to the lens barrel 11 at three places at its bottom, the drive force is transmitted to the lens barrel 11, so that unnecessary deformation may be generated, and a mounting side of the position sensor 102 may be deformed. If the lens barrel 11 is made rigid by, for example, thickening its flat portion, the whole area of the bottom side of the change-direction member 115 can be joined to the lens barrel 11.

Figure 5A:
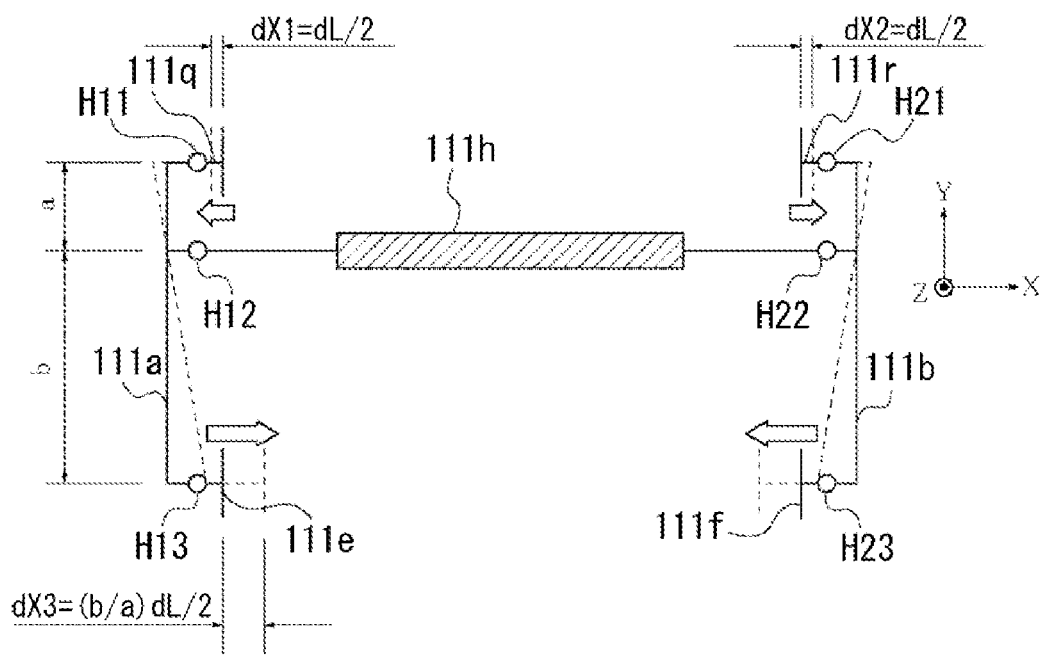
FIGS. 5A and 5B illustrate movement of a link mechanism of the drive mechanism.
Figure 5B:
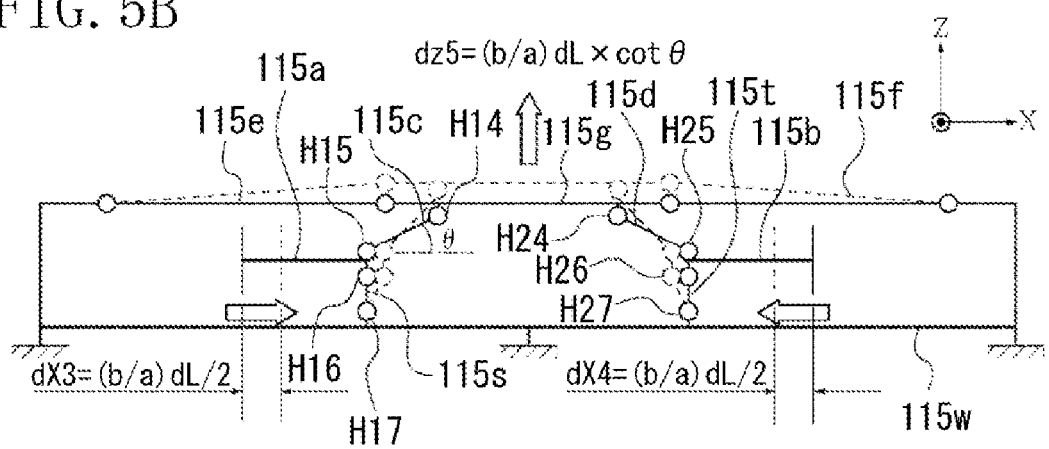

Next, a movement of the link mechanism of the main body 111 and the change-direction member 115 will be described with reference to FIGS. 5A and 5B. FIGS. 5A and 5B illustrate the drive mechanism 110 as schematic versions of FIGS. 4A and 4B.

The displacement retrieval links 111a and 111b are connected to the piezo receive links 111q and 111r via elastic hinges H11 and H21. Further, the displacement retrieval links 111a and 111b are connected to the fix link 111h via elastic hinges H12 and H22. Furthermore, the displacement retrieval links 111a and 111b are connected to the connection links 111e and 111f via elastic hinges H13 and H23.

Positions of these elastic hinges can be adjusted by the above-described piezo adjustment screw 113, which is provided on both of the piezo receive links 111q and 111r. The elastic hinges H11, H12, and H13 provided on the main body 111 can be aligned in a straight line parallel to the Y-axis, and also the elastic hinges H21, H22, and H23 can be aligned in a straight line parallel to the Y-axis from the viewpoint of accuracy of motion.

When a voltage is applied to two electrode terminals (not shown) of the piezo actuator 112, the overall length L of the piezo actuator 112 is extended in the X-axis direction by a length dL. Then, the piezo receive link 111q is displaced to the left by dX1=dL/2, and the piezo receive link 111r is displaced to the right by dX2=dL/2 as illustrated in FIG. 5A. As a result, the displacement retrieval link 111a rotates about the Z-axis at a minute angle with the hinge H12 at the center, and the connection link 111e is displaced to the right by dX3. Likewise, the displacement retrieval link 111b rotates about the Z-axis at a minute angle with the hinge H22 at the center, and the connection link 111f is displaced to the right by dX4.

As illustrated in FIG. 5A, if the length of each of the displacement retrieval links 111a and 111b before the displacement of the piezo actuator 112 as shown by a solid line is defined as a+b, each of the displacement dX3 and dX4 will be b/a times of the displacement dX1 and dX2. According to the present exemplary embodiment, this magnification is defined as geometric magnification α of the main body 111. Since a drive loss may occur at the time the geometric magnification α decreases when displacement retrieval links 111a and 111b are deformed by bending or when the elastic hinges are stretched too much, extra attention should be given to the shape of the links.

As illustrated in FIG. 5B, displacement of the connection links 111e and 111f in the X-axis direction is transmitted to the horizontal links 115a and 115b of the change-direction member 115. When the horizontal links 115a and 115b are displaced in the X-axis direction, the change-direction links 115c and 115d, which are arranged at an angle θ to the X-axis, rotate, and a lens frame drive link 115g, which is linked to the change-direction links 115c and 115d, is displaced in the Z-axis direction by a length dZ5.

The horizontal links 115a and 115b and the change-direction links 115c and 115d are linked via elastic hinges H15 and H25, while the change-direction links 115c and 115d and the lens frame drive link 115g are linked via elastic hinges H14 and H24.

The displacement dZ5 is generally cot θ times of the displacement (mean value) of the horizontal links 115a and 115b. According to the present exemplary embodiment, this magnification is defined as geometric magnification β of the change-direction member 115. Geometric magnification of the whole drive mechanism 110 including the main body 111 and the change-direction member 115 is represented as geometric magnification γ. The geometric magnification γ is a product of the geometric magnifications of the main body 111 and the change-direction member 115 (α×β).

In order to retrieve a large displacement from the small displacement dL of the piezo actuator 112 to increase a drive range of the optical element 1, at least one of either α and β can be large. The geometric magnification α can be made large by reducing the shape parameter "a" of the displacement retrieval links 111a and 111b and increasing the shape parameter "b". The geometric magnification β can be made large by reducing the angle θ.

However, increasing the length b results in increasing a diameter of the lens barrel 11, and may not satisfy design constraints. On the other hand, increasing the enlargement ratio will lead to lower natural frequency of the drive mechanism 110, which causes degraded property of a pattern image or reduction in drive speed due to, for example, vibration transmitted to the optical element 1 from outside of the lens barrel 11, and thus consideration is necessary. Considering the vibration, the geometric magnification γ can be between 0.7 and 2.0. Further, considering the space in the Z-axis direction, the angle θ that is formed between the change-direction links 115c and 115d and the X-axis can be set within a range of 30 degrees to 60 degrees. In this case, the geometric magnification β can be approximately between 0.57 and 1.72.

As described above, according to the extension of the piezo actuator 112, the lens frame drive link 115g is displaced in the Z-axis direction. The lens frame drive link 115g can be displaced only in the Z-axis direction and not in the X-axis and the Y-axis directions. Accordingly, auxiliary links are provided.

Support links 115e and 115f, which are linked to the left and right sides of the lens frame drive link 115g, control displacement of the lens frame drive link 115g in the X-axis direction. According to the support links 115e and 115f, the lens frame drive link 115g can move in the Z-axis direction but cannot move in the X-axis direction.

Additionally, support links 115s and 115t are provided to control displacement of the lens frame drive link 115g in the Y-axis direction. The support links 115s and 115t are linked to the horizontal links 115a and 115b via elastic hinges H16 and H26 and further linked to a fix link 115w via elastic hinges H17 and H27. The support links 115s and 115t are arranged at an end of the horizontal links 115a and 115b nearer to the center and limit the movement of the horizontal links 115a and 115b in the Y-axis direction while allowing them to move in the X-axis direction.

Since the movement of the horizontal links 115a and 115b in the Y-axis direction is limited, the movement of the change-direction links 115c and 115d and the lens frame drive link 115g in the Y-axis direction is limited. According to the above-mentioned configuration, the area of the lens frame mount screw hole 115j in the lens frame drive link 115g is displaced only in the Z-axis direction and not in the X-axis and the Y-axis directions. Accordingly, the support frame 104, which is joined to the lens frame drive link 115g, can be accurately driven in the Z-axis direction.

The main body 111 is configured such that each of the displacement retrieval links 111a and 111b rotates with each of the elastic hinges H12 and H22 at its center. Thus, the horizontal links 115a and 115b of the change-direction member 115 tend to make a small displacement in the Y-axis direction in a strict sense, and the lens frame drive link 115g tends to be displaced in the Y-axis direction according to the displacement of the horizontal links 115a and 115b. Although this displacement is controlled by the auxiliary links, the control may not be enough depending on the required drive accuracy. Such displacement other than the displacement in the Z-axis direction may cause deformation of the support frame 104, and further may lead to deformation of the lens, and may result in deterioration of the optical performance. Thus, it is desirable to limit the displacement of the lens frame drive link 115g in the Y-axis direction as small as possible.

The actuator 112 drives the support frame 104 relative to the lens barrel 11 as described above.

Next, an optical element control system 20 configured to control the optical element 1 will be described with reference to FIG. 6.

The optical element control system 20 includes a plurality of optical element central processing units (CPUs) (or control circuits) 22 configured to control a plurality of optical elements. Each optical element CPU 22 controls the drive of each optical element based on outputs from the position sensors 102. Three piezo drivers 21 and three position sensors 102 are connected to each optical element CPU 22. The piezo actuator 112 is connected to each piezo driver 21. Each position sensor 102 includes two sensors as described above. One is for detecting displacement in the optical axis direction and the other is for detecting displacement in the radial direction.

Further, each optical element CPU 22 configured to control the optical element is connected to an exposure apparatus CPU 23 configured to control the exposure apparatus. The exposure apparatus CPU 23 is connected to a vibration isolation mechanism control system 24, an illumination control system 25 configured to control illumination mode and light intensity of the illumination unit 4, a reticle stage control system 26, and a wafer stage control system 27.

Figure 7:
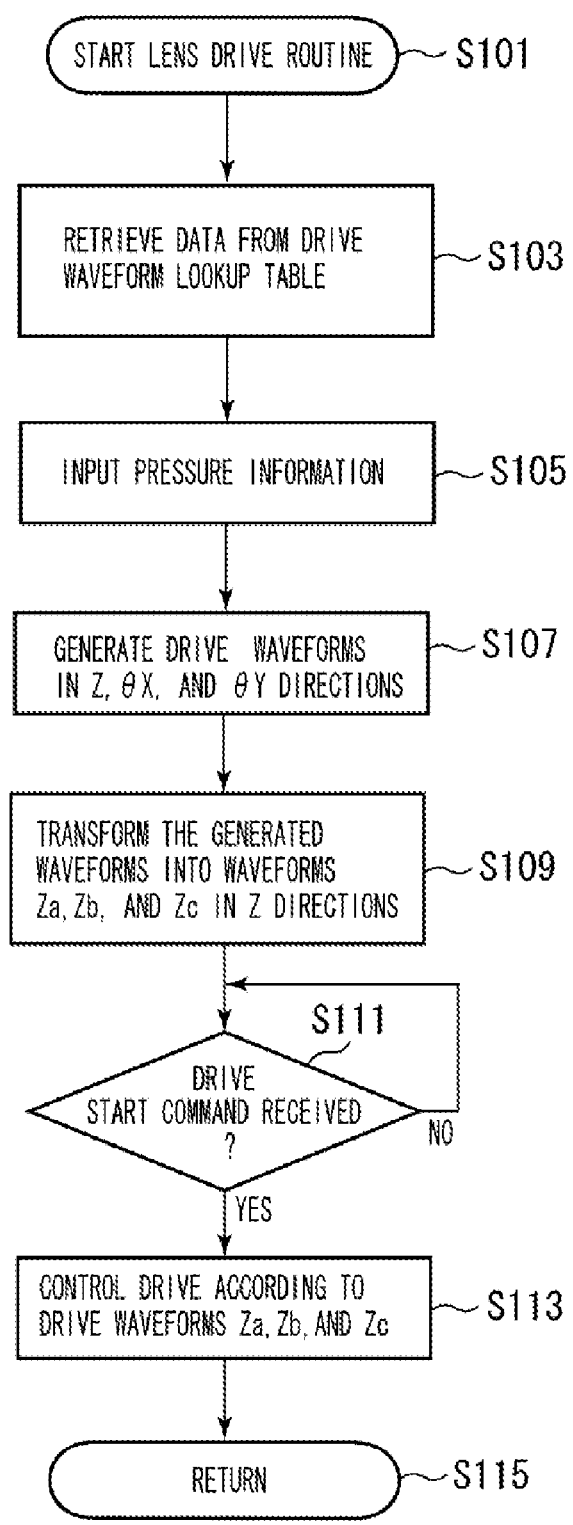
FIG. 7 is a flowchart illustrating control of the optical element.

Next, a control sequence for the optical element using the optical element control system 20 illustrated in FIG. 6 will be described with reference to FIG. 7.

In step S101, the optical element CPU 22 communicates with the exposure apparatus CPU 23 to start the optical element drive routine.

In step S103, the optical element CPU 22 accesses a lookup table including information on drive waveform for the optical element 1 via the exposure apparatus CPU 23 and retrieves data from the lookup table. This lookup table includes correction parameters, such as an amount of drive correction for the optical element 1, drive waveform for real-time correction of various types of aberrations that are generated during scanning, and a correction amount used for correcting changes in optical characteristics of the optical element 1, in an illumination mode. Changes in optical characteristics of the optical element 1 occur by, for example, heat generation when an illumination light is absorbed by the optical element.

Next, in step S105, the optical element CPU 22 detects an ambient pressure about the optical element 1 with a pressure sensor (not shown). Based on this air pressure, the optical element CPU 22 calculates a correction amount for correcting the position of the optical element 1. By correcting the position of the optical element 1 in this way, effect caused by refractive index change due to air pressure can be reduced.

Next, in step S107, the optical element CPU 22 generates drive waveforms for the optical element 1 in the Z-axis, the θx, and the θY directions based on information acquired in steps S103 and S105.

In step S109, the optical element CPU 22 transforms the axes of the waveforms in three axial directions (Z, θx, θy), generated in step S107, into drive waveforms in the Z-axis direction (Za, Zb, Zc) for each drive mechanism 110.

In step S111, the optical element CPU 22 waits until it receives a drive start command from the exposure apparatus CPU 23. If the optical element CPU 22 does not receive the drive start command (NO in step S111), then the CPU 22 waits in that state. If the optical element CPU 22 receives the drive start command (YES in step S111), then in step S113, the optical element CPU 22 starts to drive the optical element 1.

In step S113, the optical element CPU 22 drives the optical element 1, while monitoring outputs from the position sensors 102, according to the drive waveforms generated in step S109.

One optical element drive routine ends after the process goes through steps S101 to S113. This routine is repeated when the process proceeds to step S115.

By executing the above processes, image formation performance of the optical element 1 can be improved. Further, by performing similar control of drive of a plurality of optical elements 1, the whole image formation performance of the projection optical system 7 can be optimized and the pattern of the reticle 5 can be projected onto the wafer 8 with high precision.

Second Exemplary Embodiment

Next, a holding apparatus for an optical element according to a second exemplary embodiment of the present invention will be described with reference to FIGS. 8A to 9B. Components similar to those in the first exemplary embodiment are denoted by the same reference numerals and those not referred to in the present exemplary embodiment are to be regarded as similar to the first exemplary embodiment.

Figure 8A:
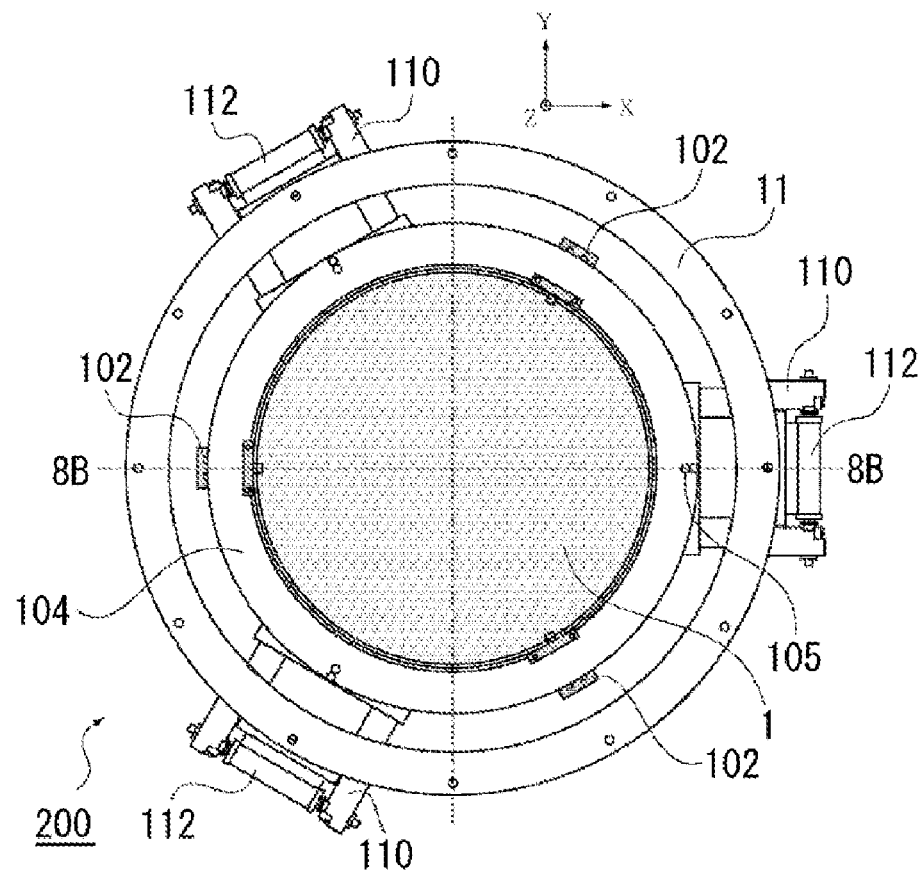
FIGS. 8A and 8B illustrate an example holding apparatus according to a second exemplary embodiment of the present invention.
Figure 8B:
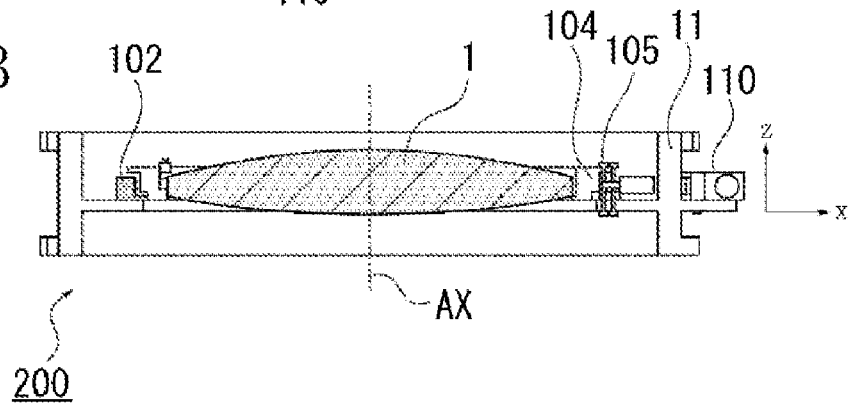

FIG. 8A is an internal plan view of the lens barrel 11 illustrated in FIG. 1 as viewed from the optical axis direction. FIG. 8B is a cross section taken along line 8B-8B in FIG. 8A.

The holding apparatus 200 includes a support frame (supporting member) 104. The support frame 104 contacts a periphery of the optical element 1 at a plurality of places and supports the optical element 1. Further, the holding apparatus 200 includes a position sensor 102 configured to detect displacement of the optical element 1 or a target member mounted on the optical element 1, and a drive mechanism including an actuator configured to move the optical element 1 based on an output from the position sensor 102. The position sensor 102 is provided at a plurality of places.

The support frame 104 contacts the optical element 1 in the optical axis direction at a projection portion 106 (support portion) provided on the support frame 104 and supports the optical element 1. The optical element 1 is supported in the radial direction by an adhesive, which is filled in a small gap between the support frame 104 and the optical element 1. The projection portion 106 is provided along the periphery of the optical element 1 in three places around the optical axis at an angular interval of approximately 120°. In other words, the support frame 104 supports the optical element 1 in three places around the optical axis in the rotation direction at equal intervals.

Six notches are provided along the periphery of the support frame 104, which supports the optical element 1. Each of three notches out of the six notches is joined to an output portion of a drive mechanism 110 by a support frame mounting screw 105.

Further, the rest of the notches are arranged in a position opposite to the position sensors 102. The size of the holding apparatus 200 can be reduced by arranging a portion, which the position sensor 102 detects, at the inner side of the notches on the support frame 104. The notches in the present exemplary embodiment can be made smaller than those in the first exemplary embodiment, and further, the three notches can be omitted.

The drive mechanism 110 and the position sensor 102 are arranged in three places around the optical axis at an angular interval of approximately 120°. The drive mechanism 110 (or a piezo actuator 112) and the position sensor 102 are displaced 60° with respect to each other. This arrangement contributes to improving space efficiency and reducing the size of the holding apparatus 200.

Figure 9A:
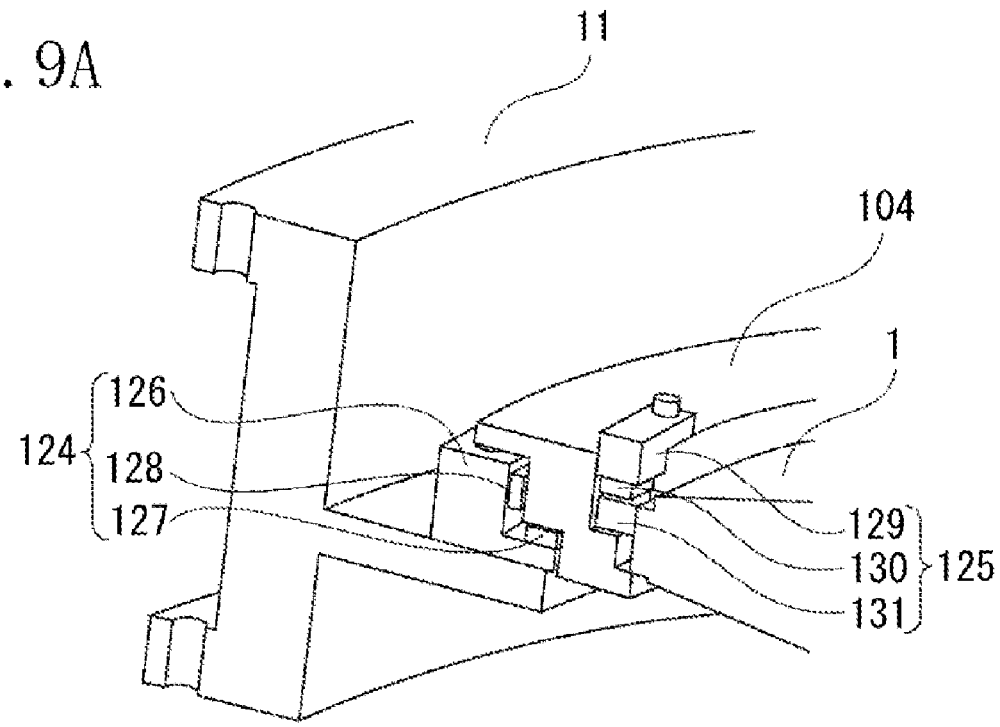
FIGS. 9A and 9B are detail drawings of an example position sensor according to the second exemplary embodiment of the present invention.
Figure 9B:
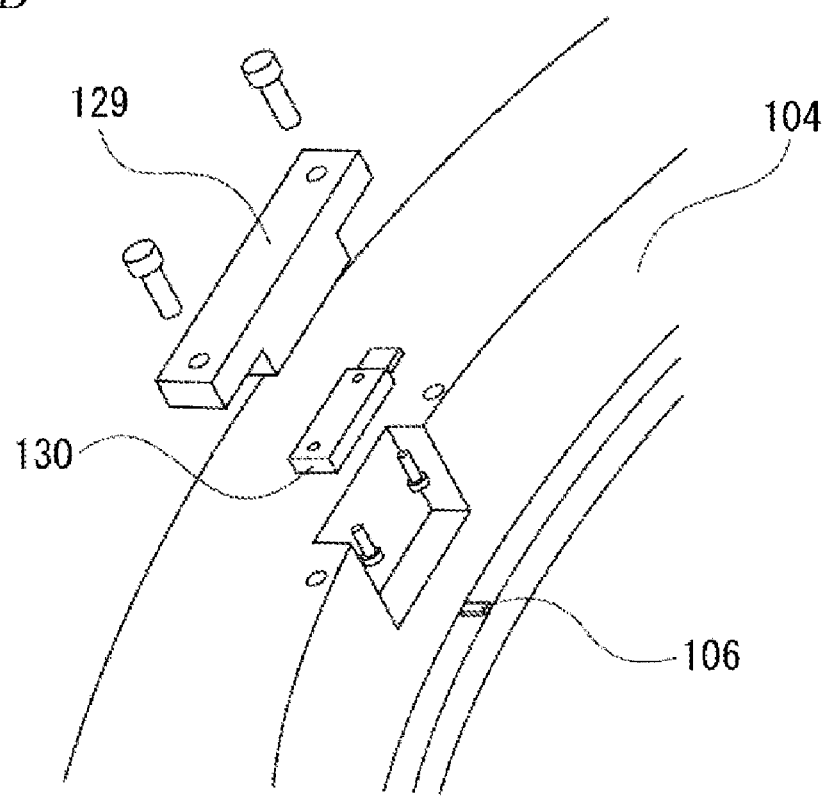

FIG. 9A is a detail drawing of the position sensor 102 illustrated in FIG. 8A. The position sensor 102 includes a first sensor 124, which is mounted on the lens barrel 11, configured to detect relative displacement of the support frame 104 to the lens barrel 11. Further, the position sensor 102 includes a second sensor 125, which is mounted on the support frame 104, configured to detect a relative position of the optical element 1 or a target member 131 mounted on the optical element 1 to the support frame 104. FIG. 9A illustrates an example where the second sensor 125 detects the position of the target member 131.

The first sensor 124 includes a sensor bracket 126 mounted on the lens barrel 11 and a sensor head that is fixed to the sensor bracket 126 with a screw. The sensor head includes a Z-sensor head 127 and an R-sensor head 128. The Z-sensor head 127 detects relative displacement in the optical axis direction. The R-sensor head 128 detects relative displacement in the radial direction perpendicular to the optical axis.

Further, portions to be detected by the Z-sensor head 127 and the R-sensor head 128 are provided on the support frame 104. According to the present exemplary embodiment, a plane perpendicular to the optical axis of the support frame 104 and a plane perpendicular to the radial direction of the support frame 104 are set as the portions to be detected. However, a target member having portions to be detected can be fixed to the support frame 104 by adhesion, welding, or screwing.

FIG. 9B is an exploded view of the second sensor 125. The second position sensor 125 includes a sensor bracket 129 that is provided at the support frame 104 and a sensor head that is fixed to the sensor bracket 129 with a screw. The sensor head includes a Z-sensor head 130 configured to detect a relative displacement in the optical axis direction.

Further, a target member 131 is mounted on the optical element 1. The target member 131 is detected by the sensor head 130. A material of the target member 131 is similar to the material of the target material 123 described in the first exemplary embodiment.

According to the present exemplary embodiment, the displacement of the target member 123 mounted on the optical element 1 is detected. However, the displacement of the optical element 1 itself can be detected. By detecting displacement of the optical element 1 or the target member 123 mounted on the optical element 1, measurement error due to deformation of the support frame 104 or difference in tilt of the support frame 104 and the optical element 1 can be reduced.

Further, the optical element 1 may be deformed in the optical axis direction by gravitation at portions other than those supported by the projection portions 106. Additionally, the support frame 104 may be slightly deformed when the optical element 1 is rotated around the X-axis or the Y-axis by the drive mechanism 110. According to the present exemplary embodiment, a portion where the projection portion 106 contacts the optical element 1 and a portion to be detected by the position sensor 125, which is the target member 131, are located in substantially the same direction in a rotation direction around an axis of rotation.

In this context, contact portions where the projection portion 106 contacts the optical element 1 exist substantially on a first plane, and the axis of rotation is an axis that is perpendicular to the first plane and passes through a center of gravity of the optical element 1. Then, an allowable limit of difference between the arrangement of the portion where the projection portion 106 contacts the optical element 1 and the portion detected by the position sensor 125 in the same direction depends on an optical sensitivity of the optical element 1, in other words, permissible error of the optical element 1. For example, if the difference is within a range of ±5 degrees, in most cases, the difference does not cause a tilt angle detection error. Further, the optical element 1 can be located so that it does not interfere with the drive mechanism 110 even if the diameter of the optical element 1 is relatively small. In this way, the detection can be performed where the above-described deformation is small. In other words, the measurement error by deformation can be reduced further.

Further, in place of the axis of rotation that passes through the center of gravity of the optical element 1, an axis perpendicular to the first plane and passing through a center of gravity of a polygon formed by connecting a plurality of contact portions with a straight line can be used as the axis of rotation. Naturally, the axis of rotation that passes through the center of gravity of the optical element 1 can coincide with the axis that passes through the center of gravity of the polygon.

According to the present exemplary embodiment, the optical axis of the optical element 1 coincides with the above-described axis of rotation. However, the present invention can also be applied to a case where the optical axis does not coincide with the axis of rotation. This case will be described in the third exemplary embodiment. In the second exemplary embodiment, the optical axis can be replaced with the above-described axis of rotation.

Further, as an alternative view, if the number of the contact portions and the sensors is three or more as with the present exemplary embodiment, directions of vertices of a polygon formed by connecting the plurality of contact portions with a straight line can substantially coincide with directions of vertices of a polygon formed by connecting the portions detected by the sensors with a straight line.

The first sensor 124 can be mounted on the projection portion 106. Further, the first sensor 124 and the second sensor 125 can be arranged at an angle in the rotation direction around the optical axis for a space-saving design.

Descriptions of the drive mechanism 110 and the control system of the present exemplary embodiment will not be repeated since they are similar to those described in the first exemplary embodiment.

As described above, the position sensor (first sensor) 124 detects relative displacement of the support frame 104 to the lens barrel 11 and the position sensor (second sensor) 125 detects relative displacement of the optical element 1 or the target member 131 to the support frame 104.

Further, according to the present exemplary embodiment, the second sensor 125 detects a tilt angle of the optical element 1 to the support frame 104. The tilt angle detected is used to control the position of the optical element 1. In other words, the optical element 1 is controlled based on a combination of the output of the first sensor 124 and the output of the second sensor 125. Thus, even when a difference in tilt between the optical element 1 and the support frame 104 occurs by deformation of the support frame 104 when the optical element 1 is tilted, the optical element 1 can be controlled to stay at a desired position. In this way, even when the support frame 104 is not sufficiently rigid, adverse effect caused by the deformation of the support frame 104 can be reduced. In other words, by forming a notch on the support frame 104 or by making the support frame 104 thinner, the size and weight of the holding apparatus can be reduced and the space efficiency can be improved.

The second sensor 125 detects a tilt angle of the optical element 1 only in the optical axis direction. However, the second sensor 125 can also be configured to detect the tilt angle in the radial direction. For example, this configuration is effective when the optical element 1 and the support frame 104 are out of alignment in the radial direction by the drive of the optical element 1 to give significant impact on the optical performance.

Third Exemplary Embodiment

Figure 10A:
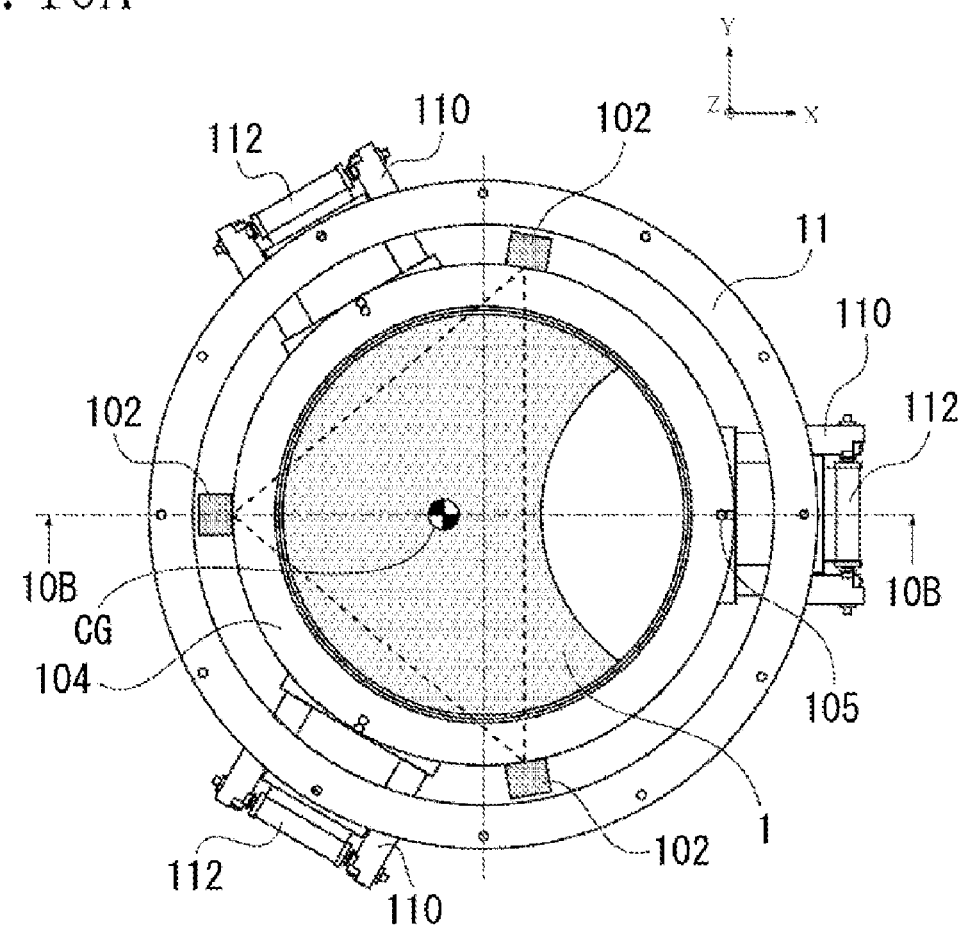
FIGS. 10A and 10B illustrate an example holding apparatus according to a third exemplary embodiment of the present invention.
Figure 10B:
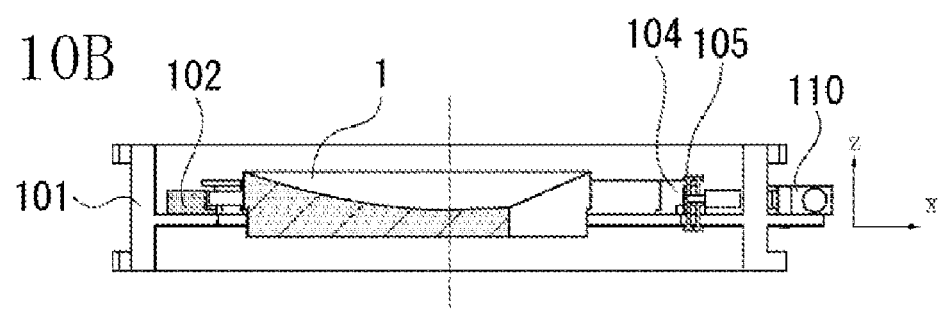

A holding apparatus for an optical element according to a third exemplary embodiment of the present invention will be described with reference to FIGS. 10A and 10B. FIG. 10A is an internal plan view of the lens barrel 11 illustrated in FIG. 1 as viewed from the optical axis direction. FIG. 10B is a cross section taken along line 10B-10B in FIG. 10A. Components similar to those in the first exemplary embodiment are denoted by the same reference numerals and those not referred to in the present exemplary embodiment are to be regarded as similar to the first exemplary embodiment.

In the first and the second exemplary embodiments, a lens is intended to be used as the optical element 1, and the position sensor 102 and the projection portion 106 are arranged around the optical axis. In a case where a mirror is used as the optical element 1, such as in the case with a reflection type optical system, as illustrated in FIG. 10A, the shape of the optical element 1 may not be circular. In this case, the projection portions 106 where the support frame 104 contacts the optical element 1 can be located at even positions with respect to a center of gravity CG of the optical element 1. This is because by arranging the projection portions 106 in the above positions, the weight of the optical element 1, which is applied to the projection portions 106 arranged in three places, will become even.

According to the present exemplary embodiment, a portion where the projection portion 106 contacts the optical element 1 and a portion to be detected by the position sensor 102, which is the target member 131, are located in substantially the same direction in a rotation direction around an axis of rotation. In this context, contact portions where the projection portion 106 contacts the optical element 1 exist substantially on a first plane, and the axis of rotation is an axis that is perpendicular to the first plane and passes through a center of gravity of the optical element 1. Then, an allowable limit of difference between the arrangement of the portion where the projection portion 106 contacts the optical element 1 and the portion detected by the position sensor 125 in the same direction depends on an optical sensitivity of the optical element 1, in other words, permissible error of the optical element 1. However, if the difference is within a range of ±5 degrees, in most cases, the difference does not cause a tilt angle detection error. Further, the optical element 1 can be located so that it does not interfere with the drive mechanism 110 even if the diameter of the optical element 1 is relatively small.

Further, in place of the axis of rotation that passes through the center of gravity of the optical element 1, an axis perpendicular to the first plane and passing through a center of gravity of a polygon formed by connecting a plurality of contact portions with a straight line can be used as the axis of rotation. The axis of rotation that passes through the center of gravity of the optical element 1 can coincide with the axis that passes through the center of gravity of the polygon.

Although the degree of the coincidence depends on an optical sensitivity and a weight of the optical element 1, both axes can be within a range of a radius of 30 mm on the above-described plane. Further, as an alternative view, if the number of contact portions and the sensors is three or more as in the present exemplary embodiment, directions of vertices of a polygon formed by connecting a plurality of contact portions with a straight line can substantially coincide with directions of vertices of a polygon formed by connecting the portions detected by the sensors with a straight line.

Fourth Exemplary Embodiment

A holding apparatus for an optical element according to a fourth exemplary embodiment of the present invention will be described with reference to FIGS. 11A and 11B. In the first exemplary embodiment, the optical element 1 and the support frame 104 are joined to the projection portions 106 in three places with an adhesive. In the fourth exemplary embodiment, the optical element 1 and the support frame 104 are mechanically clamped.

Figure 11A:
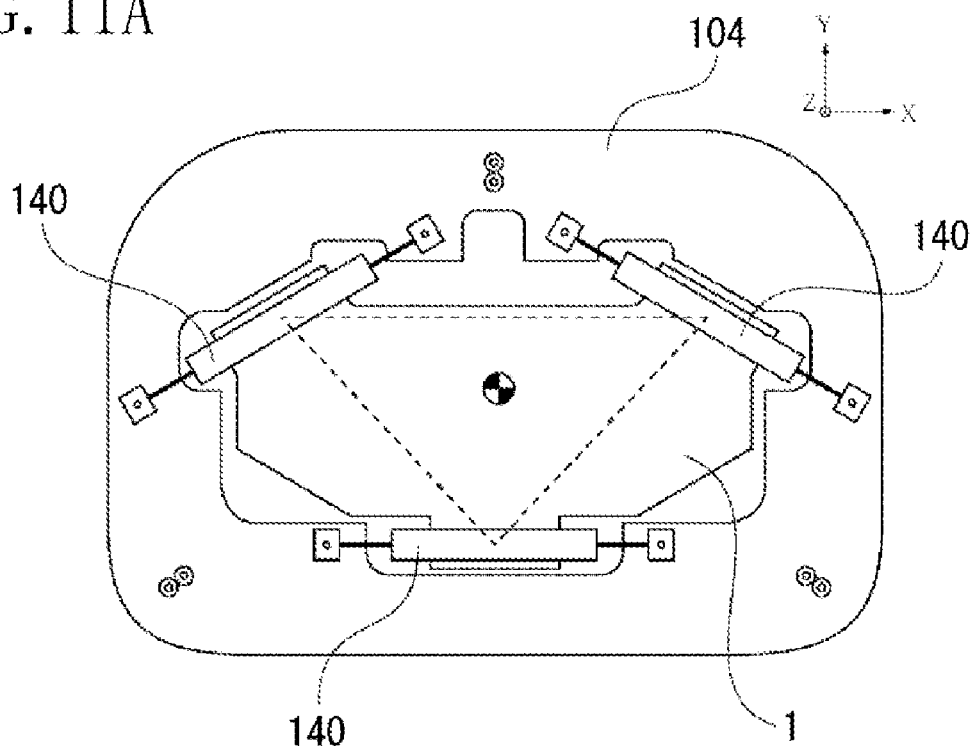
FIGS. 11A and 11B illustrate an example holding apparatus according to a fourth exemplary embodiment of the present invention.
Figure 11B:
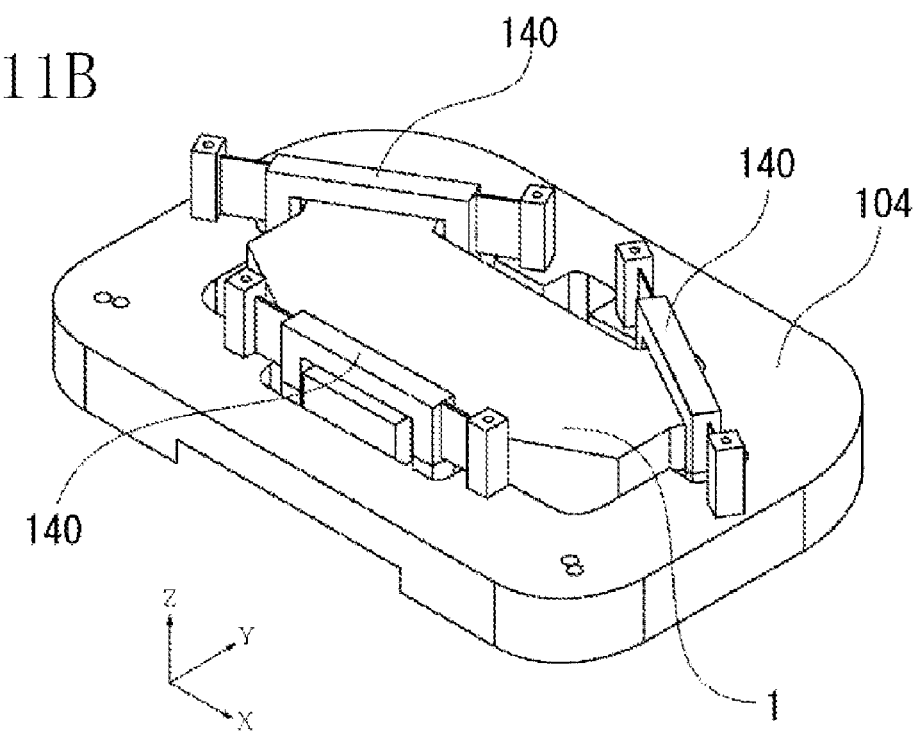

In FIGS. 11A and 11B, as a supporting member configured to support the optical element 1 by contact at three places along the periphery of the optical element 1, three clamp mechanisms 140 are provided. Although sensors and actuators are omitted from the figures, they are provided as in the first and the second exemplary embodiments.

According to the present exemplary embodiment, a portion where the clamp mechanism 140 contacts the optical element 1 and a portion to be detected by the position sensor are located in substantially the same direction in a rotation direction around an axis of rotation. In this context, contact portions where the clamp mechanism 140 contacts the optical element 1 exists substantially on a first plane, and the axis of rotation is an axis that is perpendicular to the first plane and passes through a center of gravity of the optical element 1. Then, an allowable limit of difference between the arrangement of the portion where the clamp mechanism 140 contacts the optical element 1 and the portion detected by the position sensor in the same direction depends on an optical sensitivity of the optical element 1, in other words, permissible error of the optical element 1. For example, if the difference is within a range of ±5 degrees, in most cases, the difference does not cause a tilt angle detection error. Further, the optical element 1 can be located so that it does not interfere with the drive mechanism 110 even if the diameter of the optical element 1 is relatively small.

In this way, the detection can be performed where the above-described deformation is small. In other words, the measurement error by deformation can be reduced further.

Further, in place of the axis of rotation that passes through the center of gravity of the optical element 1, an axis perpendicular to the first plane and passing through a center of gravity of a polygon formed by connecting a plurality of contact portions with a straight line can be used the an axis of rotation. Naturally, the axis of rotation that passes through the center of gravity of the optical element 1 can coincide with the axis that passes through the center of gravity of the polygon.

According to the present exemplary embodiment, the optical axis of the optical element 1 coincides with the above-described axis of rotation. However, the present invention can also be applied to a case where the optical axis does not coincide with the axis of rotation.

Further, as an alternative view, if the number of the contact portions and the sensors is three or more as with the present exemplary embodiment, directions of vertices of a polygon formed by connecting the plurality of contact portions with a straight line can substantially coincide with directions of vertices of a polygon formed by connecting the portions detected by the sensors with a straight line. It is to be noted that a center of gravity of the area of the contact portions can be regarded as a representative point of the contact area.

Figure 12:
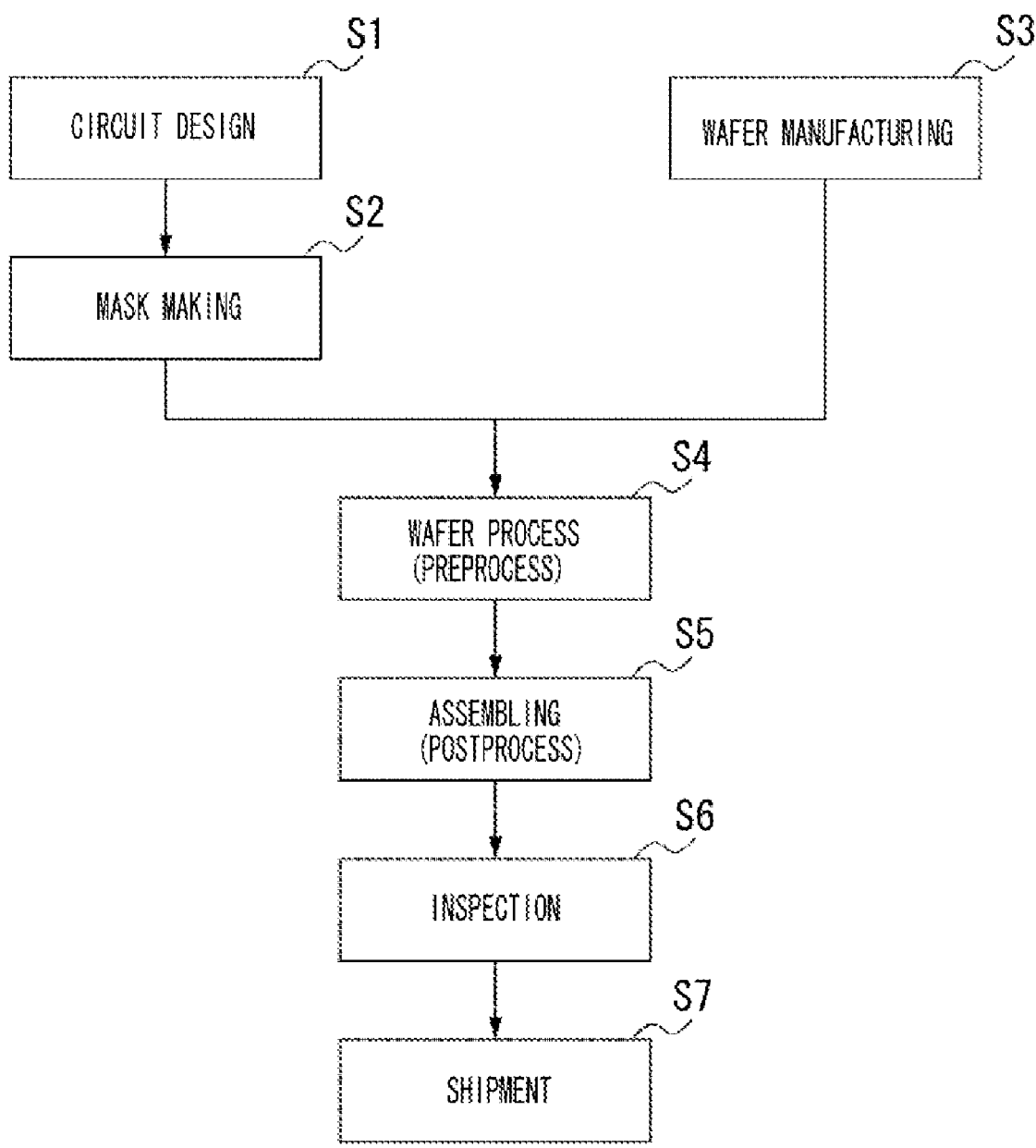
FIG. 12 is a flowchart illustrating an example device manufacturing method using an exposure apparatus.

Next, referring to FIGS. 12 and 13, a device manufacturing method using the above-described exposure apparatus will be described. FIG. 12 is a flowchart illustrating exemplary manufacturing processes for a semiconductor device (e.g., an integrated circuit (IC), a large scale integration (LSI), a liquid crystal display (LCD), and a charge-coupled device (CCD)). A semiconductor chip is taken as an example of the semiconductor device in FIG. 12.

Step S1 is a circuit design process for designing a circuit of a semiconductor device. Step S2 is a mask making process for fabricating a mask, which can be referred to as an original plate or a reticle, based on a designed circuit pattern. Step S3 is a wafer manufacturing process for manufacturing a wafer, which can be referred to as a substrate, from a silicon or comparable material. Step S3 can be a reticle manufacturing process. Step S4 is a wafer process, which can be referred to as "preprocess", for forming an actual circuit on a wafer using an exposure apparatus with the above-described prepared mask according to the lithography technique. Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing) Step S6 is an inspection process for inspecting the semiconductor device manufactured in step S5. The inspection includes an operation confirmation test and an endurance test. Step S7 is a shipment process for shipping the semiconductor device completed through the above-described processes.

Figure 13:
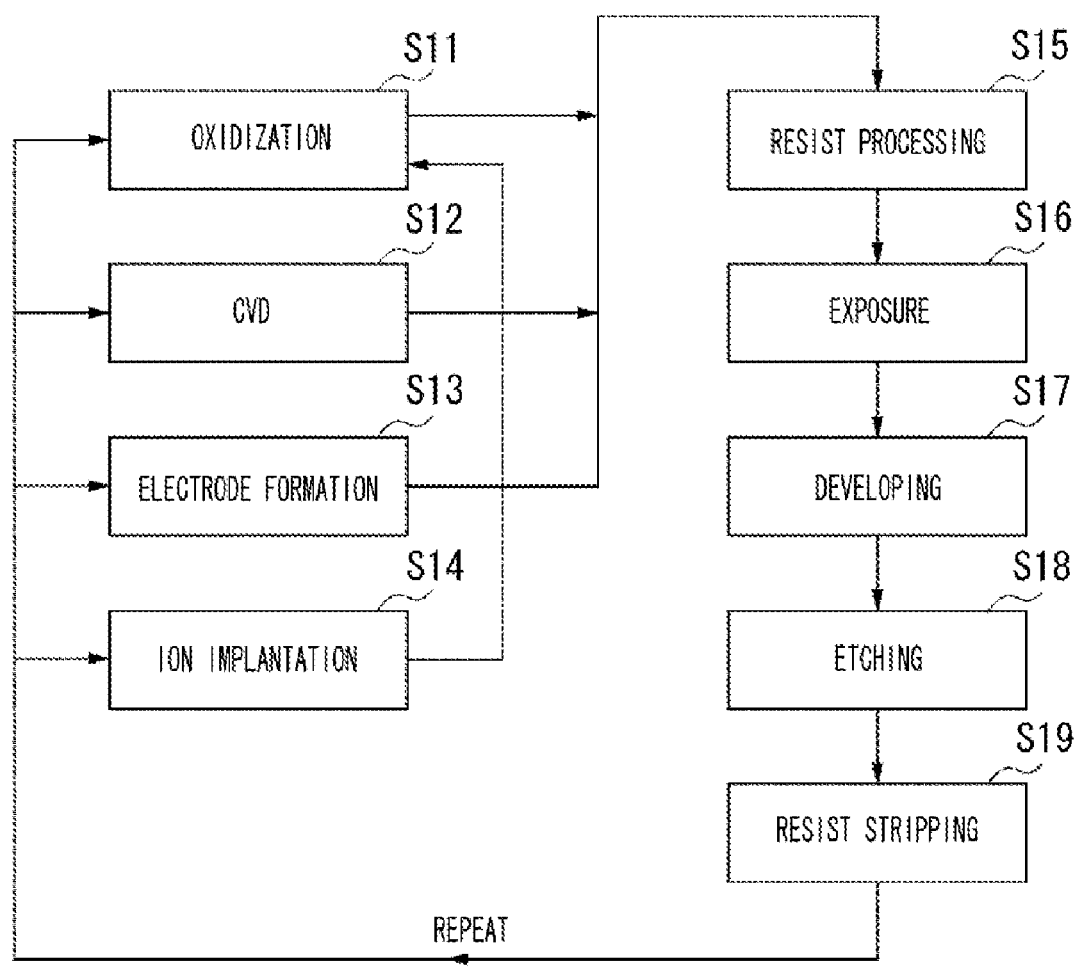
FIG. 13 is a flowchart illustrating details of a wafer process in step S4 in the flowchart illustrated in FIG. 10.
Figure 14:
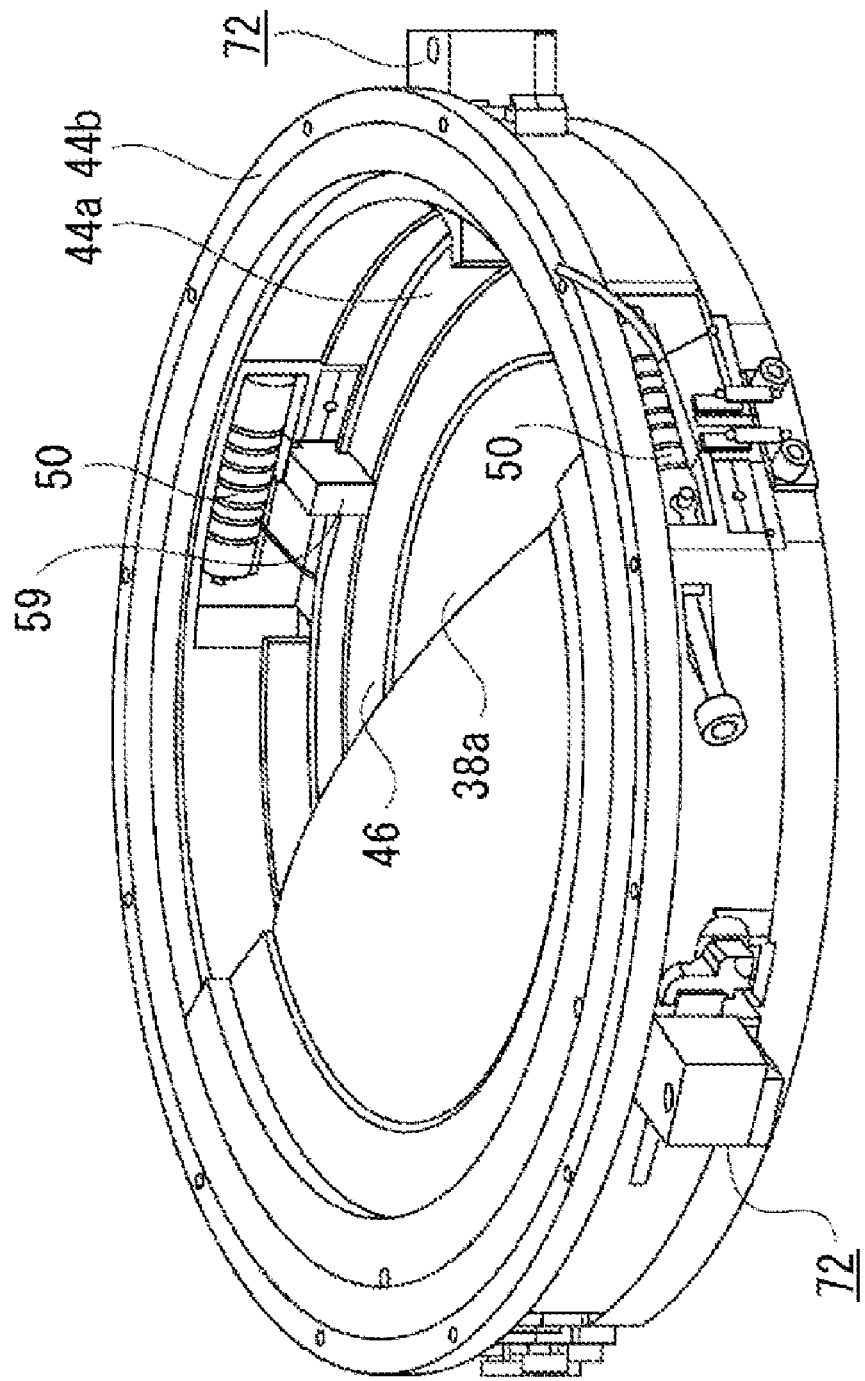
FIG. 14 illustrates a conventional holding apparatus.
Figure 15:
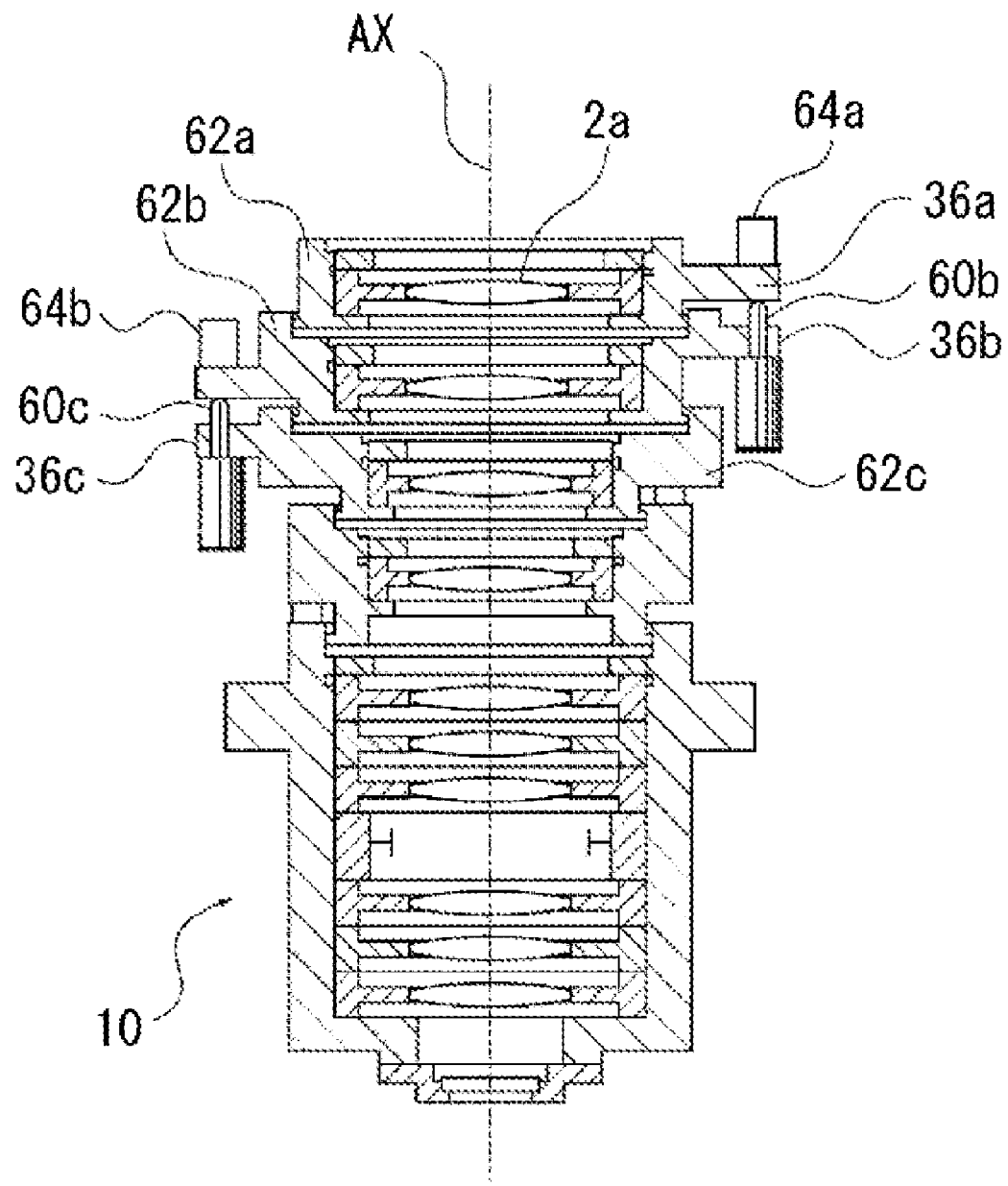
FIG. 15 illustrates another conventional holding apparatus.

As illustrated in FIG. 13, the above-described wafer process in step S4 includes an oxidation step S11 for oxidizing a wafer surface, a chemical vapor deposition (CVD) step S12 for forming an insulating film on the wafer surface, and an electrode formation step S13 for forming electrodes on the wafer by vaporization. Furthermore, the wafer process in step S4 includes an ion implantation step S14 for implanting ions into the wafer, a resist processing step S15 for coating the wafer with a photosensitive material, and an exposure step S16 for exposing the wafer subjected to the resist processing step to light using the above-described exposure apparatus with a mask having a circuit pattern. Furthermore, the wafer process in step S4 includes a developing step S17 for developing the wafer exposed in the exposure step S16, an etching step S18 for cutting a portion other than a resist image developed in the developing step S17, and a resist stripping step S19 for removing an unnecessary resist remaining after the etching step S18. The processing repeating the above-described steps can form multiple circuit patterns on a wafer.

According to the above-described exemplary embodiments of the present invention, a holding apparatus that is capable of measuring a position of an optical element while reducing measurement error caused by a deformation of a supporting member that supports the optical element or by a difference of tilt between the optical element and the supporting member can be realized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Applications No. 2007-049367 filed Feb. 28, 2007 and No. 2008-043071 filed Feb. 25, 2008, which are hereby incorporated by reference herein in their entirety.

What is claimed is:

1. A holding apparatus configured to hold an optical element, the holding apparatus comprising:
    a supporting member configured to support the optical element, the supporting member including a plurality of projection portions that contact the optical element;
    a plurality of sensors configured to detect a position of the optical element via a plurality of portions to be detected on the optical element or on a member joined to the optical element; and
    an actuator configured to drive the supporting member based on outputs from the plurality of sensors,
    wherein a direction of each vertex of a polygon formed by connecting the plurality of projection portions with a straight line substantially coincides with a direction of each vertex of a polygon formed by connecting the plurality of portions to be detected with a straight line.

2. The holding apparatus according to claim 1, wherein the plurality of projection portions are located in three places at even intervals around an optical axis of the optical element.

3. A holding apparatus configured to hold an optical element, the holding apparatus comprising:
    a supporting member configured to support the optical element, the supporting member including a plurality of projection portions that contact the optical element;
    a plurality of sensors configured to detect a position of the optical element via a plurality of portions to be detected on the optical element or on a member joined to the optical element; and
    an actuator configured to drive the supporting member based on outputs from the plurality of sensors,
    wherein the plurality of projection portions exist substantially on a same plane, and
    wherein, if an axis perpendicular to the plane and passing through a center of gravity of a polygon formed by connecting the plurality of projection portions with a straight line is set as an axis of rotation, the plurality of projection portions are located in substantially a same direction as the plurality of portions to be detected in a direction of rotation around the axis of rotation.

4. The holding apparatus according to claim 3, wherein the axis of rotation coincides with an optical axis of the optical element.

5. A holding apparatus configured to hold an optical element, the holding apparatus comprising:
    a supporting member configured to support the optical element, the supporting member including a plurality of projection portions that contact the optical element;
    a plurality of sensors configured to detect a position of the optical element via a plurality of portions to be detected on the optical element or on a member joined to the optical element; and
    an actuator configured to drive the optical element based on outputs from the plurality of sensors,
    wherein the plurality of projection portions exist substantially on a same plane, and
    wherein, if an axis perpendicular to the plane and passing through a center of gravity of the optical element is set as an axis of rotation, the plurality of projection portions are located in substantially a same direction as the plurality of portions to be detected in a direction of rotation around the axis of rotation.

* * * * *